United States Patent
Apalkov et al.

(10) Patent No.: US 9,460,397 B2
(45) Date of Patent: Oct. 4, 2016

(54) QUANTUM COMPUTING DEVICE SPIN TRANSFER TORQUE MAGNETIC MEMORY

(71) Applicant: Samsung Electronics Co., Ltd., Gyeonggi-do (KR)

(72) Inventors: Dmytro Apalkov, San Jose, CA (US); Matthew J. Carey, San Jose, CA (US); Mohamad Towfik Krounbi, San Jose, CA (US); Alexey Vasilyevitch Khvalkovskiy, Milpitas, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/478,877

(22) Filed: Sep. 5, 2014

(65) Prior Publication Data
US 2015/0097159 A1    Apr. 9, 2015

Related U.S. Application Data

(60) Provisional application No. 61/886,744, filed on Oct. 4, 2013.

(51) Int. Cl.
| G06N 99/00 | (2010.01) |
| G11C 11/16 | (2006.01) |
| G11C 11/14 | (2006.01) |

(Continued)

(52) U.S. Cl.
CPC ............ *G06N 99/002* (2013.01); *G11C 11/14* (2013.01); *G11C 11/16* (2013.01); *G11C 11/18* (2013.01); *H01F 10/329* (2013.01); *H01F 41/302* (2013.01); *H01L 27/222* (2013.01); *H01L 43/08* (2013.01); *H01L 43/12* (2013.01); *H01F 10/3272* (2013.01); *H01F 10/3286* (2013.01)

(58) Field of Classification Search
CPC ... G06N 99/002; H01L 49/006; G11C 11/16; G11C 11/14; G11C 11/5607; B82Y 10/00
See application file for complete search history.

(56) References Cited

U.S. PATENT DOCUMENTS

| 6,563,310 B2 | 5/2003 | Zagoskin |
| 6,563,311 B2 | 5/2003 | Zagoskin |

(Continued)

OTHER PUBLICATIONS

"Perpendicular magnetic anisotropy materials for reduced current switching devices," Z. R.Tadisina, Ph.D. Dissertation, pp. 1-100, 2010.

(Continued)

*Primary Examiner* — Harry W Byrne
*Assistant Examiner* — Ajay Ojha
(74) *Attorney, Agent, or Firm* — Convergent Law Group LLP

(57) ABSTRACT

A quantum computing device magnetic memory is described. The quantum computing device magnetic memory is coupled with a quantum processor including at least one quantum device corresponding to at least one qubit. The quantum computing device magnetic memory includes magnetic storage cells coupled with the quantum device(s) and bit lines coupled to the magnetic storage cells. Each of the magnetic storage cells includes at least one magnetic junction. The magnetic junction(s) include a reference layer, a nonmagnetic spacer layer, and a free layer. The nonmagnetic spacer layer is between the reference layer and the free layer. The magnetic junction(s) are configured to allow the free layer to be switched between stable magnetic states. The magnetic junction(s) are configured such that the free layer has a nonzero initial writing spin transfer torque in an absence of thermal fluctuations.

20 Claims, 12 Drawing Sheets

(51) Int. Cl.
*H01L 43/08* (2006.01)
*H01L 43/12* (2006.01)
*H01L 27/22* (2006.01)
*H01F 41/30* (2006.01)
*G11C 11/18* (2006.01)
*H01F 10/32* (2006.01)

(56) References Cited

U.S. PATENT DOCUMENTS

| | | | |
|---|---|---|---|
| 6,728,131 B2 | 4/2004 | Ustinov | |
| 7,001,787 B2 | 2/2006 | Tanamoto | |
| 7,418,283 B2 | 8/2008 | Amin | |
| 7,615,771 B2 | 11/2009 | Fontana | |
| 7,732,881 B2 | 6/2010 | Wang | |
| 7,977,668 B2 | 7/2011 | Nevirkovets | |
| 8,003,410 B2 | 8/2011 | Kerner | |
| 8,169,821 B1 | 5/2012 | Ranjan | |
| 8,190,553 B2 | 5/2012 | Routt | |
| 8,270,209 B2 | 9/2012 | Herr | |
| 8,374,048 B2 | 2/2013 | Apalkov | |
| 8,385,107 B2 | 2/2013 | Prejbeanu | |
| 8,399,941 B2 | 3/2013 | Apalkov | |
| 8,423,103 B2 | 4/2013 | Hennessy | |
| 8,426,222 B2 | 4/2013 | Lou | |
| 8,467,235 B2 | 6/2013 | Slonczewski | |
| 9,076,537 B2 | 7/2015 | Khvalkovskiy | |
| 2002/0064004 A1 | 5/2002 | Worledge | |
| 2003/0184921 A1* | 10/2003 | Sugita et al. | 360/324.1 |
| 2008/0063557 A1 | 3/2008 | Ishida | |
| 2008/0246104 A1* | 10/2008 | Ranjan et al. | 257/421 |
| 2009/0039345 A1 | 2/2009 | Gustavsson | |
| 2009/0109739 A1* | 4/2009 | Ranjan et al. | 365/171 |
| 2011/0089405 A1 | 4/2011 | Ladizinsky | |
| 2011/0102948 A1* | 5/2011 | Apalkov et al. | 360/324.2 |
| 2012/0155154 A1* | 6/2012 | Shukh | 365/158 |
| 2013/0148419 A1 | 6/2013 | Prejbeanu | |
| 2014/0280427 A1* | 9/2014 | Bocharov et al. | 708/523 |

OTHER PUBLICATIONS

"Self-consistent simulation of quantum transport and magnetization dynamics in spin-torque based devices," S. Salahuddin, Applied Physics Letters, vol. 89, 153504, pp. 1-3, Oct. 11, 2006.

* cited by examiner

QUANTUM COMPUTING DEVICE SPIN TRANSFER TORQUE MAGNETIC MEMORY

CROSS-REFERENCE TO RELATED APPLICATIONS

This application claims the benefit of provisional Patent Application Ser. No. 61/886,744, filed Oct. 4, 2013, entitled STT-RAM USABLE FOR QUANTUM COMPUTING, assigned to the assignee of the present application, and incorporated herein by reference.

BACKGROUND OF THE INVENTION

Quantum computers utilize quantum mechanical principles in order to perform calculations and quantum devices to form the processor of the quantum computing device. Quantum mechanical phenomena at work may include the superposition of quantum states (the probabilistic nature of quantum mechanics allowing for multiple states simultaneously). The quantum devices used may include superconducting quantum interference devices (SQUIDs), which have quantum mechanical magnetic states. A SQUID may thus correspond to a quantum bit (qubit) for the quantum computing device. At certain temperatures the SQUID may exist in multiple magnetic states simultaneously, exhibiting the superposition of states mentioned above. The presence of multiple states may allow the quantum computing device to more rapidly perform calculations than a conventional deterministic computer.

Most current quantum computing devices operate at very low temperatures to allow the qubits to retain their superposed states for long enough to perform the desired calculations. Further, the calculation speed may increase as temperature decreases. Thus, the operating temperatures of the relevant portions of the quantum computing device are well under 10 Kelvin.

Conventional quantum computing device magnetic memories contain storage cells that may use Josephson junctions as the storage elements. The storage cells in the conventional quantum computing device memory may be local to the qubits. For example, a fabric of SQUIDs and Josephson junctions may form the processor and memory of the quantum computing device. Although separately addressable, the magnetic memory storage cells may still be physically close to the quantum device corresponding to the qubit. The magnetic memories for quantum computers typically operate at the same very low temperatures at which processing is performed. Although described as storing a qubit, the state actually stored in the magnetic memory is a single state of the quantum device. Stated differently, the quantum device may be measured so that the multiple probabilistic states of a qubit may be collapsed down to a single, deterministic state for storage in the magnetic memory.

Although conventional quantum computing device and their memories may function, as quantum computing devices are developed, additional memories are desired. Such quantum computing device memories may be desired to be capable of fast operation at the very low temperatures used in quantum computing devices. Magnetic devices used by other conventional magnetic memories may not be appropriate for such quantum computing device memories. For example, conventional magnetic tunneling junctions are not typically used in quantum computing device magnetic memories because such devices have too high a resistance at low temperatures, may be too slow to program at low temperatures and may have other issues.

Accordingly, what is needed is a method and system that may provide fast magnetic memories capable of operation at low temperatures such as sub-ten Kelvin temperatures. In some cases, the operational temperature may be desired to be well under one Kelvin. The method and system described herein address such a need.

BRIEF SUMMARY OF THE INVENTION

The exemplary embodiments provide a method and system for providing quantum computing device magnetic memories. The quantum computing device magnetic memory is coupled with a quantum processor including at least one quantum device corresponding to at least one qubit. The quantum computing device magnetic memory includes magnetic storage cells coupled with the quantum device(s) and bit lines coupled to the magnetic storage cells. Each of the magnetic storage cells includes at least one magnetic junction. The magnetic junction(s) include a reference layer, a nonmagnetic spacer layer, and a free layer. The nonmagnetic spacer layer is between the reference layer and the free layer. The magnetic junction(s) are configured to allow the free layer to be switched between stable magnetic states. The magnetic junction(s) are configured such that the free layer has a nonzero initial writing spin transfer torque in an absence of thermal fluctuations.

DETAILED DESCRIPTION OF THE INVENTION

Figure 1:
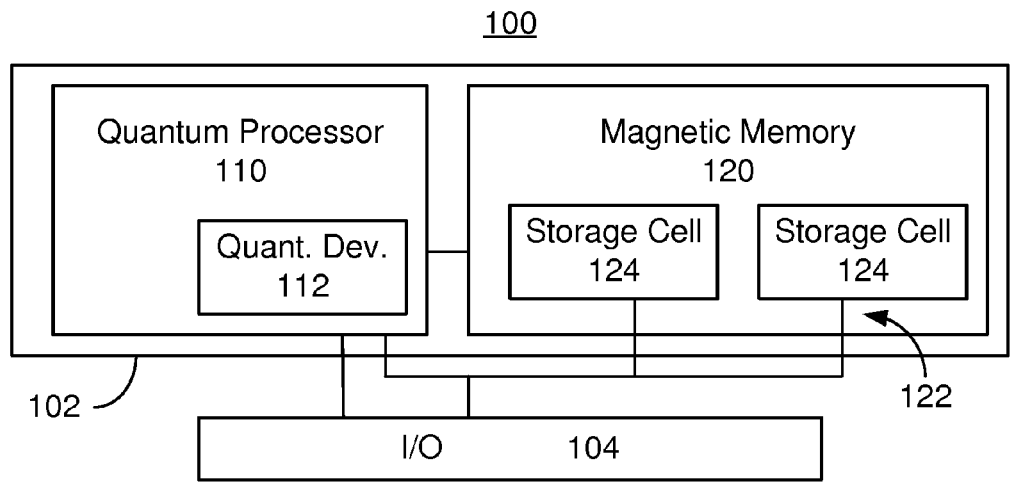
FIG. 1 depicts an exemplary embodiment of a quantum computing device.

The exemplary embodiments relate to quantum computing device magnetic memories and the magnetic junctions usable therein. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments provide quantum computing device magnetic memories. The quantum computing device magnetic memory is coupled with a quantum processor including at least one quantum device corresponding to at least one qubit. The quantum computing device magnetic memory includes magnetic storage cells coupled with the quantum device(s) and bit lines coupled to the magnetic storage cells. Each of the magnetic storage cells includes at least one magnetic junction. The magnetic junction(s) include a reference layer, a nonmagnetic spacer layer, and a free layer. The nonmagnetic spacer layer is between the reference layer and the free layer. The magnetic junction(s) are configured to allow the free layer to be switched between stable magnetic states. The magnetic junction(s) are configured such that the free layer has a nonzero initial writing spin transfer torque in an absence of thermal fluctuations.

The exemplary embodiments are described in the context of particular magnetic junctions and quantum computing device magnetic memories having certain components. One of ordinary skill in the art will readily recognize that the present invention is consistent with the use of magnetic junctions and quantum computing device magnetic memories having other and/or additional components and/or other features not inconsistent with the present invention. The method and system are also described in the context of current understanding of the spin transfer phenomenon, of magnetic anisotropy, and other physical phenomena. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

FIG. 1 is a block diagram depicting an exemplary embodiment of a quantum computing device 100. For clarity, FIG. 1 is not to scale and portions of the quantum computing device 100 are not shown. The quantum computing device 100 includes a quantum processor 110, quantum computing device magnetic memory 120 and input/output (I/O) device 104. In the embodiment shown, the quantum processor 110 and quantum computing device magnetic memory 120 are located in a low temperature environment 102. As used herein, a low temperature environment is significantly below room temperature (roughly twenty-five degrees Celsius). For example, in some embodiments, the low temperature environment 102 includes temperature(s) less than ten Kelvin. In some such embodiments, the temperature may be less than one Kelvin. The low temperature environment 102 is at the desired operating temperature(s) of the quantum processor 110. The quantum processor 110 includes quantum devices 112, of which only one is shown for simplicity. The quantum device 112 may be a SQUID or analogous quantum device corresponding to one or more qubits. In some embodiments, therefore, the low temperature environment 102 may be the working temperature of the SQUID. In other embodiments, the low temperature environment may simply be sufficiently low to take advantage of superconducting circuitry that may be used for the quantum processor 110 and/or magnetic memory 120.

The quantum processor 110 is coupled with magnetic memory 120. The magnetic memory 120 is a quantum computing device magnetic memory that operates at substantially the same temperature as the quantum processor 110. Thus, the magnetic memory 120 may operate at temperatures of less than ten Kelvin and, in some embodiments, less than one Kelvin. In other embodiments, the magnetic memory 120 operates at low temperatures appropriate for superconducting circuitry in the quantum computing device 100.

The quantum computing device magnetic memory 120 includes storage cells 124 (of which only two are shown for simplicity) and bit lines 122. The storage cells 124 are addressable using bit lines 122 and, in some embodiments, additional circuitry such as selection device(s), word lines and/or other lines. The bit lines 122 are thus coupled with the storage cells 124 and may be connected with the I/O 104 and/or the quantum processor 110. The storage cells 124 may be arranged in an array in the quantum computing device magnetic memory 100. The quantum computing device magnetic memory 120 is shown as coupled with the quantum processor 110 because the storage cells 124 store the deterministic states of the quantum devices 112 in the quantum processor 110. In some embodiments, the storage cells 124 may be interleaved with and adjacent to the quantum devices 112. For example, a storage cell 124 may be in physical proximity and hard wired to a quantum device 112 for which the storage cell 124 stores the qubit. The quantum processor 110 and magnetic memory 120 may thus form a quantum processor-memory fabric. However, in other embodiments, the magnetic memory 120 and quantum processor may be in separate locations and/or storage cells 124 may store qubits from multiple quantum devices 112, in a manner analogous to a conventional random access memory. In both cases, however, the quantum processor 110 and magnetic memory 120 may both reside in the low temperature environment 102.

Because the magnetic memory 120 functions in a low temperature environment 102 and is desired to be sufficiently fast to take advantage of the speeds of the quantum processor 110, constraints may be placed on the magnetic memory 120 that are different from magnetic memories designed to be operated at room temperature or higher. In particular, the resistance of the magnetic junctions (not shown in FIG. 1) may be desired to be not more than ten ohms at the low/operating temperature(s) of the low temperature environment 102. In some embodiments, the resistance is less than ten Ohms. Further, the magnetic anisotropy of the magnetic junctions may be desired to be low and sufficiently controlled that the storage cells 124 in the memory are substantially all within the desired tolerances. As a result, the internal shift field, or net magnetic field due to layers within the magnetic junction, may also be desired to be low. A low anisotropy may reduce the write current used in programming the magnetic memory 120. For example, the maximum write current density used may be ten $MA/cm^2$. In some embodiments, the write current density may be at least 0.1 $MA/cm^2$ and not more than 5 $MA/cm^2$. In some such embodiments, the write current density may be at least 0.5 $MA/cm^2$ and not more than 5 $MA/cm^2$. Further, for spin transfer torque (STT) magnetic memories, the magnetic state of the magnetic junction may be switched using a spin polarized current driven through the magnetic junction. However, most conventional STT magnetic memories have their stable states at a stagnation point, relying upon thermal fluctuations to pull the magnetic moment of the free layer from the stagnation point in order for the STT to exert a nonzero torque on the magnetic state. Such conventional magnetic memories have a zero initial torque on the free layer magnetic moment. Because the magnetic memory 120 resides in the low temperature environment, these thermal fluctuations may be at or near zero. Thus, as used herein, "zero thermal fluctuations" or "without thermal fluctuations" correspond to the low amplitude of thermal fluctuations expected for a magnetic memory 120 in the low temperature environment 102. For example, in some embodiments, "without thermal fluctuations" does not mean identically zero thermal fluctuations, but instead means the amplitude of thermal fluctuations expected for the low temperature environment 102. Conventional STT magnetic memories may not be appropriate for use in the low temperature environment 102 because the lack of thermal fluctuations translate to more difficulty in programming the magnetic memory 120 using STT and, therefore, long write times and/or high write currents. In contrast, the magnetic memory 120 is configured such that the initial spin transfer torque is nonzero even in the low temperature environment 102/for no thermal fluctuations. For example, the switching speed for the magnetic memory 120 may be at least fifty picoseconds to not more than fifty nanoseconds. In some embodiments, the switching speed for the storage cell 124 is at least one hundred picoseconds and not more than twenty nanoseconds.

Figure 2:
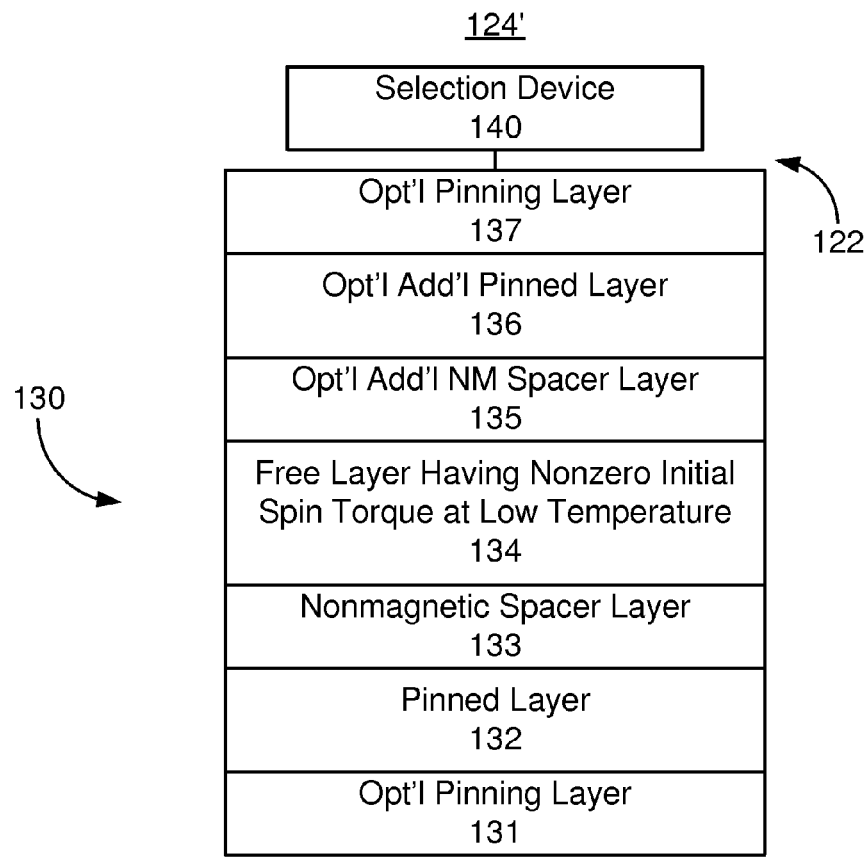
FIG. 2 depicts an exemplary embodiment of a magnetic storage cell including a magnetic junction having a free layer with a nonzero initial spin transfer torque at low temperature.

FIG. 2 depicts an exemplary embodiment of a magnetic storage cell 124' that may be used in the quantum computing device magnetic memory 120 as the magnetic storage cell 124. For clarity, FIG. 2 is not to scale and not all of the storage cell 124 may be shown. Referring to FIGS. 1 and 2, the magnetic storage cell 124' is coupled to the bit line 122 of the quantum computing device magnetic memory 120. The magnetic junction 124' includes a magnetic junction 130 and, optionally, a selection device 140. In some embodiments, the selection device 140 may be omitted and selection may be achieved in another manner. Further, the magnetic storage cell 124' may include multiple magnetic junction 130 that are the same or different from each other.

The magnetic junction 130 is configured such that the magnetic junction 130 can store data, be read and be written to with acceptable data and error rates and with sufficiently low write current in the low temperature environment 102. The magnetic junction 130 includes a number of layers, at least some of which are optional. The magnetic junction 130 includes an optional pinning layer 131, a pinned or reference layer 132, a nonmagnetic spacer layer 133, a free layer 134 in which data are stored magnetically, an optional additional nonmagnetic spacer layer 135, an optional additional pinned or reference layer 136 and an optional additional pinning layer 137. The pinning layers 131 and 137 may include antiferromagnetic (AFM) layer(s) which may be used to fix or pin the magnetic moment(s) of the reference layer 132. For example, the pinning layer(s) 131 and/or 137 may include PtMn, IrMn, FeRh, FeRhRu and/or other AFM materials. In other embodiments, the magnetic moment(s) of the reference layer(s) 132 and 136 may be pinned in another manner. In some embodiments, the internal anisotropy of the reference layer 132 and/or 136 may be sufficient to fix their magnetic moment(s) for desired operation. The nonmagnetic spacer layer 133 and, in some embodiments, the optional additional nonmagnetic spacer layer 135 may be metallic. For example, the nonmagnetic spacer layer(s) 133 and/or 135 may include materials such as one or more of Ag, AgSn, Cu, Cr and Ge. As a result, the resistance of the magnetic junction 130 may be within the desired range even in the low temperature environment 102. For example, in some embodiments, the resistance of the magnetic junction 130 is at least one Ohm and not more than ten Ohms (e.g. not more than 0.01 $\Omega\text{-}\mu m^2$ resistance-area (RA) product) in the low temperature environment.

The reference layer 132, free layer 134 and optional additional reference layer 136 are magnetic. The layers 132, 134 and 136 may thus include magnetic materials, such as Co, Ni, Fe and/or other materials as well as their alloys. One or more of the layers 132, 134 and 136 may include multiple sublayer(s). Some or all of these sublayers are magnetic. For example, one or more of the reference layer 132, free layer 134 and optional additional reference layer 136 may be a synthetic antiferromagnet (SAF) including multiple ferromagnetic layers interleaved with and sandwiching nonmagnetic layer(s). In such a multilayer the ferromagnetic sublayers may be magnetically coupled through the nonmagnetic layers and antiferromagnetically aligned. In other multilayers, the ferromagnetic sublayers may be ferromagnetically aligned. For example, Co/Pt, Fe/Pt, Co/Pd, and/or Fe/Pd multilayers might be used to provide the desired perpendicular anisotropy in the reference layer(s) 132 and/or 136. In other embodiments, one or more of Co/Fe—Pt/Pd combinations (multilayers and/or alloys), Fe/W multilayers, amorphous rare earth metals such as FeTb, CoFeTb, GdFe, and/or GdFeTb, and/or barium ferrite might be used for the reference layer 132 and/or 136. In addition, other structures are possible.

The free layer 134 stores data magnetically. Stated differently, the free layer 134 is switchable between two or more stable magnetic states. For example, one such stable state may be with the magnetic moment of the free layer 134 substantially aligned with that of the reference layer 132. Another such stable state may occur for the magnetic moment of the free layer 134 substantially antialigned (antiparallel to) the magnetic moment of the reference layer 132. However, other configurations may be possible. The data stored may be read based on the magnetoresistance of the magnetic junction 130, which depends upon the degree of alignment between the magnetic moment of the free layer 134 and that of the reference layer(s) 132 and 136. In some embodiments, the free layer 134 is written using spin transfer torque (STT) and/or an analogous phenomenon. In some embodiments, STT alone is used in writing to the magnetic junction 130. In other embodiments, other methods may be used in addition to or in lieu of STT. Further, the magnetic junction 130 is configured such that the free layer 134 has a nonzero initial writing spin transfer torque in an absence of thermal fluctuations. As discussed above, the absence of thermal fluctuations correspond to expected thermal fluctuations for the free layer 134 magnetic moment at the temperature of the low temperature environment 102. Thus, the initial writing spin transfer torque is nonzero for the free layer 134 when the free layer 134 is in one of its stable states, the magnetic junction 130 is selected to be written to, when or shortly after writing commences and when the free layer 134 is in the low temperature environment 102.

The magnetic junction 130 may also be configured such that a shift magnetic field is substantially balanced at the free layer 134. The shift magnetic field is a net magnetic field within the free layer 134, including an internal magnetic field due to portions of the magnetic junction 130. For example, the internal magnetic field at the free layer 134 may correspond to the magnetic field due to the magnetic moment(s) of the reference layer 132 and the magnetic moment(s) of the optional additional reference layer 136. Because the shift magnetic field is substantially balanced at the free layer, the shift magnetic field is less than ten Oe throughout some or all of the free layer 134. In some embodiments, the shift magnetic field is less than two Oe throughout some or all of the free layer when the shift magnetic field is balanced at the free layer 134. Balancing of the shift magnetic field may allow for the magnetic anisotropy of the free layer 134 to be sufficiently low. Thus, a lower write current to be used.

In addition, the magnetic junction 130 is desired to have a sufficiently high giant magnetoresistance for reading of the magnetic junction 130, and thus the memory 120, to be achieved. To provide such a magnetoresistance, materials such as Heusler alloys and/or half-metals might be used in the free layer 134. Further, half-metallic layer(s) may adjoin the nonmagnetic spacer layer(s) 133 and 135 at the interfaces with the layer(s) 132, 134 and/or 136 to increase the magnetoresistance of the magnetic junction 130. Thus, the magnetoresistance (AR/R) for the magnetic junction may be at least ten percent.

The magnetic junction 130 may be configured in a number of ways in order to achieve the characteristics described above. For example, the magnetic junction 130 may be fabricated such that when the free layer 134 is in a stable magnetic state, the free layer 134 is not at a stagnation point. In some embodiments this corresponds to the stable state of the magnetic moment of the free layer 134 being canted from a free layer stagnation point along a free layer easy axis. In some embodiments, the magnetic junction 130 is an extended orthogonal spin transfer junction. In such an embodiment, the reference layer 132 has magnetic moment(s) that are orthogonal to the magnetic moment(s) of the reference layer 136 and free layer 134. In such embodiments, the initial STT torque is nonzero due to the orthogonal orientation of the magnetic moment(s) of the reference layer 132. In addition, the reference layer 132 and/or 136 has sidewalls that extend further than those of the free layer 134. The other reference layer, if present, may be a SAF. In some embodiments, the magnetic junction 130 is a spatially varying magnetization reference layer dual magnetic junction. In such embodiments, the local direction of the magnetic moment of the reference layer 132 and/or 136 varies from the center to the edges of the reference layer 132 and/or 136, respectively. The initial spin transfer torque is also nonzero in such an embodiment due to the reference layer 132 and/or 136 magnetic moment orientation(s). In some embodiments, the free layer 134 is a hybrid free layer. In such embodiments, the free layer 134 may be configured to be canted from the easy axis because of the free layer 134 itself. In some embodiments, the free layer 134 is switched using a magnetic field applied at a nonzero angle from the free layer easy axis. In such embodiments, the bit lines 122 may be spin-orbit coupling (SO) lines described below. In some embodiments, the free layer 134 may have a voltage controlled anisotropy that destabilizes the free layer 134 from the stable magnetic state. In such embodiments, the quantum computing device magnetic memory 120 may be configured with a cross-point architecture. In other embodiments utilizing the cross-point architecture, the free layer 134 may be switched using a SO phenomenon in addition to or in lieu of STT, as described below. In some such embodiments, magnetic polarizers and/or a SO active layer may be used to provide the spin polarized current. In some such embodiments, the spin polarized current passes through the magnetic junction 130. In other embodiments, the spin polarized current passes in proximity to, but not through the entire magnetic junction 130, as discussed below. Characteristics of two or more of the embodiments discussed above may be combined. In other embodiments, other configuration(s) may be possible.

Use of the magnetic junction 130 in the quantum computing device magnetic memory 120 allows the storage of data magnetically at the low temperature environment and the benefits of the quantum computing device 100 to be achieved. For example, a higher giant magnetoresistance for the magnetic junction 130, particularly in the low temperature environment 102, may facilitate reading of the magnetic memory 120. A lower resistance in the low temperature environment 102, for example due to metallic nonmagnetic spacer layer(s) 133 and 135, also facilitate reading and writing of the magnetic junction 130. A more balanced shift field and a lower magnetic anisotropy for the magnetic junction 130 allow for a lower write current to be used in programming the magnetic memory 120. Further, a nonzero initial spin transfer torque for the free layer 134 in the absence of thermal fluctuations (in other words while exposed to the temperature(s) of the low temperature environment 102 during operation) allows the magnetic junction 130 to be programmed at the operating temperature(s) of the magnetic memory 120. Thus, the magnetic memory 120 may be appropriate for use in the quantum computing device 100.

Figure 3:
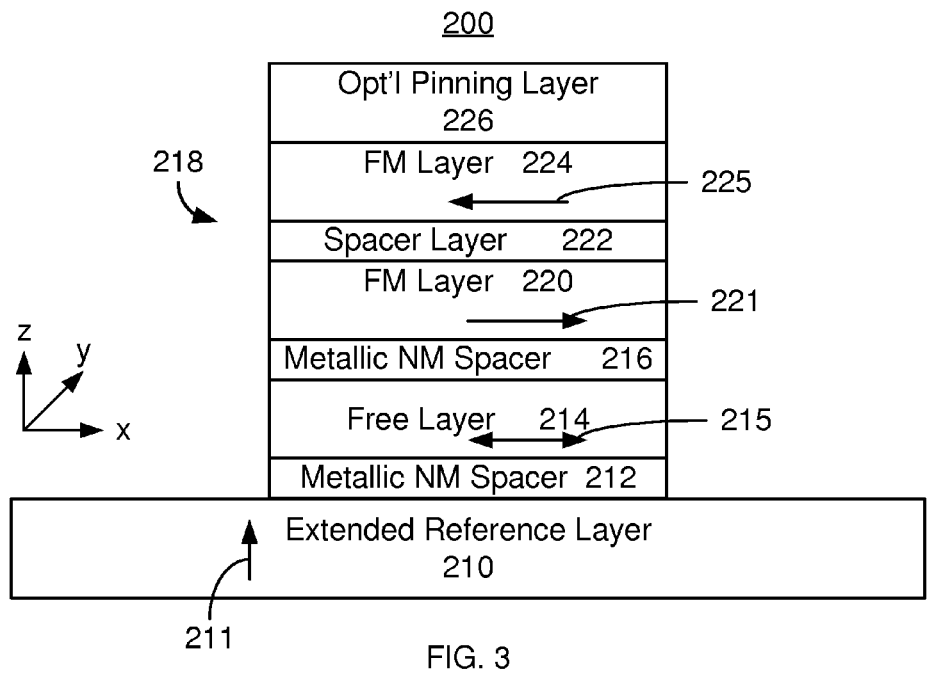
FIG. 3 depicts another exemplary embodiment of a portion of a magnetic memory including a magnetic junction having a free layer with a nonzero initial spin transfer torque at low temperature.

FIG. 3 depicts another exemplary embodiment of a portion of a magnetic memory including a magnetic junction 200 having a free layer with a nonzero initial spin transfer torque at low temperature. For clarity, FIG. 3 is not to scale. The magnetic junction 200 may be used for the magnetic junction 130 depicted in FIG. 2. Thus, the magnetic junction 200 is for use in a storage cell 124/124' of a quantum computing device magnetic memory 120. The magnetic junction 200 may be used in connection with a quantum processor 110 and may reside in and operate at the low temperature(s) of the low temperature environment 102. Further, the magnetic junction 200 is switchable between stable magnetic states. The magnetic junction 200 is also configured such that the free layer has a nonzero initial writing spin transfer torque in the absence of thermal fluctuations. In other words, the magnetic junction 200 has a nonzero initial spin transfer torque for write operations at operating temperatures of the low temperature environment 102. In some embodiments, the magnetic junction is also configured such that the shift field is substantially balanced at the free layer.

The magnetic junction 200 is an extended orthogonal spin transfer junction. The magnetic junction 200 includes a reference layer 210, a nonmagnetic metal spacer layer 212, a free layer 214, an additional nonmagnetic metallic spacer 216, an additional reference layer 218 and an optional pinning layer 226 that may be analogous to the reference layer 132, the nonmagnetic spacer layer 133, the free layer 134, the additional nonmagnetic spacer layer 135, the additional reference layer 136 and the optional pinning layer 137, respectively. For example, the nonmagnetic metal spacer layers 212 and 216 may include materials such as one or more of Ag, AgSn, Cu, Cr and Ge. As can be seen in FIG. 3, the reference layer 210 is an extended reference layer. Thus, the sidewalls of the extended reference layer 210 extend farther in at least the x-direction (in the plane of the layers) than the sidewalls of the free layer 214 and, in the embodiment shown, than the sidewalls of the remaining portion of the magnetic junction 200. In some embodiments, the sidewalls of the extended reference layer 210 also extend further in the y-direction than the sidewalls of at least the free layer 214. For example, in some embodiments, the layers 212, 214, 216, 218 and 226 have an elliptical cross-section in the x-y plane. The extended reference layer 210 may also have an elliptical-cross section. The cross-section of the extended reference layer 210 has a longer axis in at least the x-direction. In other embodiments, the extended reference layer 210 may be a line, such as the bit line 124. Thus, the extended reference layer 210 may double as part or all of the bit line 124. In such embodiments, the extended reference layer 210 may run in the x-direction.

As can be seen in FIG. 3, the magnetic moment 215 of the free layer 214 and the magnetic moments 221 and 225 of the reference layer 218 are in-plane, while the magnetic moment 211 of the extended reference layer 210 is orthogonal (substantially perpendicular to plane). Thus, not only does the extended reference layer 210 extend beyond the free layer 214, but the moment 211 is substantially orthogonal to the moments 215, 221 and 225. Hence, the magnetic junction 200 is termed an extended orthogonal reference layer magnetic junction. The extended reference layer 210 shown has a perpendicular magnetic anisotropy that exceeds the out-of-plane demagnetization energy. Thus, materials that may be used for the extended reference layer 210 may include but are not limited to Co/Fe—Pt/Pd multilayer and alloy combinations, Fe/W multilayers, amorphous rare earth materials such as FeTb, CoFeTb, GdFe, GdFeTb, and barium ferrite. Other materials having a high perpendicular anisotropy might also be used.

The reference layer 218 is a SAF including ferromagnetic layers 220 and 224 sandwiching nonmagnetic layer 222. The magnetic moments 221 and 225 of the ferromagnetic layers 220 and 224, respectively, are antiferromagnetically coupled. Because of this coupling the shift field due to the reference layer 218 is substantially balanced at the free layer 214. Similarly, because the reference layer 210 extends beyond the remainder of the magnetic junction 200 in the x-direction, the shift field due to remaining reference layer 210 may be substantially balanced at the free layer 214. In some embodiments, the extended reference layer is at least twice the length of the free layer 214 in the x-direction. The reference layer 210 may also extend further than the free layer 214 in other direction(s). In such embodiment, the length of the extended reference layer 210 may be at least twice that of the free layer in the lateral (x-y plane) directions. The magnetic moment 215 of the free layer 214 is also in-plane. The magnetic anisotropy of the free layer 214 may thus be relatively low. As a result, the write current may be reduced. Note, however, that the magnetic junction may still have a shape anisotropy and/or sufficient other magnetic anisotropy to establish stable states of the free layer 214. For example, the cross section in the x-y plane may be an ellipse having a long axis parallel to the x-axis.

The magnetic moment 215 of the free layer 214 is switchable using spin transfer. The magnetic moment 215 is thus shown as a dual headed arrow. In the stable states of the free layer 214, the magnetic moment 215 lies along the easy axis of the free layer. For example, in one stable state the magnetic moment 215 is parallel to the magnetic moment 221 while in another stable state the magnetic moment 215 is antiparallel to the magnetic moment 221. The easy axis of the free layer 214 may be considered to be the same as the magnetic moment 215 shown. Because it is desired to have a high magnetoresistance, the free layer 214 may include Heusler alloy(s) and/or half metals. For example, the free layer may include Heusler alloy(s) with $L2_1$ structure. Such alloys include $X_2YZ$, where X is selected from Cr, Mn, Fe, Co, Ru and Rh; Y is selected from Ti, V, Cr, Mn, and Fe; and Z is selected from Al, Si, P, Ga, Ge, As, In, Sn and Sb.

The magnetic junction 200 is also configured such that the free layer 214 has a nonzero initial spin transfer torque even in the absence of thermal fluctuations (i.e. at temperature(s) of the low temperature environment 102). To program the magnetic junction 200, a write current may be driven through the magnetic junction 200 in the current perpendicular-to-plane (CPP) direction. Such a write current has a nonzero initial spin transfer torque for the magnetic junction 200. This write current is spin polarized due to the magnetic moments 211 and 221 of the reference layers 210 and 218. The magnetic moment 211 is orthogonal to the free layer easy axis/stable state magnetic moment 215. Thus, at least a portion of the initial spin transfer torque is due to spins polarized parallel or antiparallel to the magnetic moment 211. These spins correspond to an initial spin transfer torque that is not along the easy axis 215. Spins that are polarized in a direction parallel to the easy axis 215 correspond to a zero initial spin transfer torque and a free layer stagnation point. Conversely spins polarized at a nonzero angle from the easy axis 215 (i.e. not in the +x or −x directions) have a nonzero initial spin transfer torque. Consequently, spins polarized by the extended (orthogonal) reference layer 210 in, e.g., the +z or −z direction, provide a nonzero initial spin transfer torque on the free layer magnetic moment 215.

Use of the magnetic junction 200 in the quantum computing device magnetic memory 120 allows the storage of data magnetically at the low temperature environment and the benefits of the quantum computing device 100 to be achieved. For example, a higher giant magnetoresistance for the magnetic junction 200 due in part to the material(s) used in the free layer, may facilitate reading of the magnetic memory 120. A lower resistance in the low temperature environment 102, for example due to metallic nonmagnetic spacer layers 212 and 222, also facilitate reading and writing of the magnetic junction 200. A more balanced shift field due to the SAF reference layer 218 and extended reference layer 210 and a lower magnetic anisotropy for moment in-plane the free layer 214 allow for a lower write current to be used in programming the magnetic junction 200 and thus the memory 120. Further, a nonzero initial spin transfer torque for the free layer 214 in the absence of thermal fluctuations (while exposed to the temperature(s) of the low temperature environment 102 during operation) allows the magnetic junction 200 to be rapidly programmed at the operating temperature(s) of the magnetic memory 120. Thus, the magnetic memory 120 may be appropriate for use in the quantum computing device 100 at least in part through the use of the magnetic junction 200.

Figure 4:
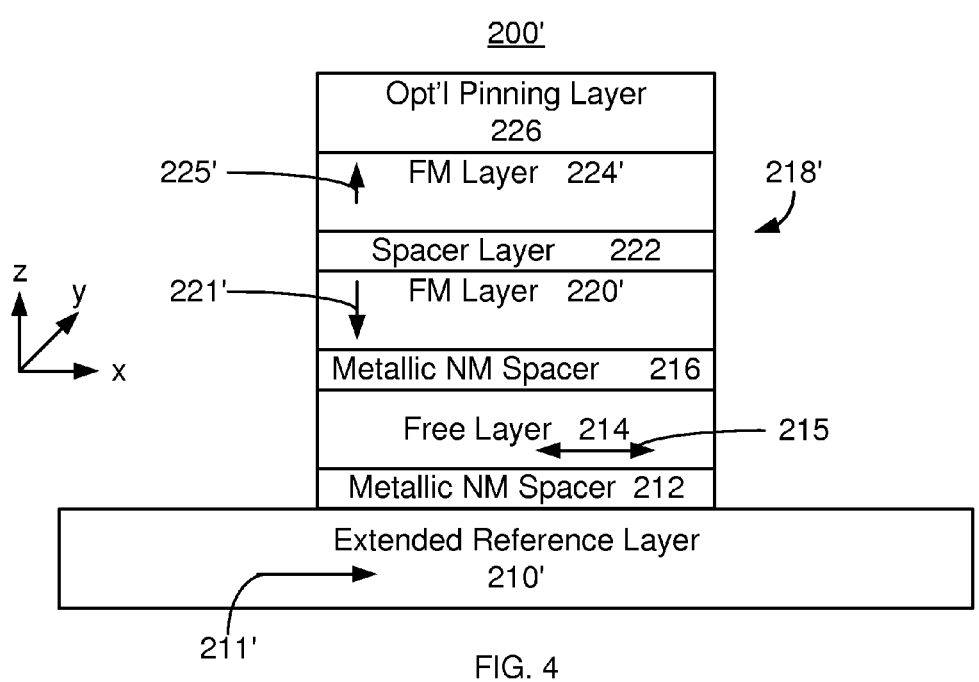
FIG. 4 depicts another exemplary embodiment of a portion of a magnetic memory including a magnetic junction having a free layer with a nonzero initial spin transfer torque at low temperature.

FIG. 4 depicts another exemplary embodiment of a magnetic junction 200' having a free layer with a nonzero initial spin transfer torque at low temperature. For clarity, FIG. 4 is not to scale. The magnetic junction 200' is analogous to the magnetic junction 200. Consequently, similar components have corresponding labels. The magnetic junction 200' may be used for the magnetic junction 130 depicted in FIG. 2. Thus, the magnetic junction 200' is for use in a storage cell 124/124' of a quantum computing device magnetic memory 120. The magnetic junction 200' may be used in connection with a quantum processor 110 and may reside in and operate at the low temperature(s) of the low temperature environment 102. Further, the magnetic junction 200' is switchable between stable magnetic states. The magnetic junction 200' is also configured such that the free layer has a nonzero initial writing spin transfer torque in the absence of thermal fluctuations. In some embodiments, the magnetic junction 200' is also configured such that the shift field is substantially balanced at the free layer.

The magnetic junction 200' is an extended orthogonal spin transfer junction including an extended reference layer 210', a nonmagnetic metal spacer layer 212, a free layer 214, an additional nonmagnetic metallic spacer 216, an additional reference layer 218' and an optional pinning layer 226 that are analogous to the reference layer 210, the nonmagnetic metal spacer layer 212, the free layer 214, the additional nonmagnetic metallic spacer 216, the additional reference layer 218 and the optional pinning layer 226, respectively. Because the reference layer 210' is an extended reference layer, the sidewalls of the extended reference layer 210' extend farther in at least one direction in the plane of the layers (e.g. the x-direction) than the sidewalls of the free layer 214. In the embodiment shown, the sidewalls of the extended reference layer 210' extend further than the sidewalls of the remaining portion of the magnetic junction 200'. In some embodiments, the sidewalls of the extended reference layer 210' also extend further in the y-direction than the sidewalls of at least the free layer 214. In some embodiments, the extended reference layer has a shape analogous to that of the remaining portion(s) of the magnetic junction 200', such as an ellipse. In other embodiments, the extended reference layer 210' may be all or part of a line, such as the bit line 124.

The free layer 214 is analogous to the free layer depicted in FIG. 3 and has a magnetic moment 215 that is in-plane. The magnetic moment of the extended reference layer 210' is also in-plane. However, the magnetic moments of the reference layer 218' are perpendicular to plane. In particular, the ferromagnetic layers 220' and 224' have magnetic moments 221' and 225', respectively. Hence, the magnetic junction 200' is still termed an extended orthogonal reference layer magnetic junction because one reference layer 210' is extended while the other 218' has orthogonal magnetic moments.

The reference layer 218' is a SAF including ferromagnetic layers 220' and 224' sandwiching nonmagnetic layer 222. The magnetic moments 221' and 225' of the ferromagnetic layers 220' and 224', respectively, are antiferromagnetically coupled. Because of this coupling the shift field due to the reference layer 218' is substantially balanced at the free layer 214. Similarly, because the reference layer 210' extends beyond the remainder of the magnetic junction 200' in the x-direction, the shift field due to remaining reference layer 210' may be substantially balanced at the free layer 214. The magnetic moment 215 of the free layer 214 is also in-plane. The magnetic anisotropy of the free layer 214 may thus be relatively low. As a result, the write current may be reduced. Note, however, that the magnetic junction may still have a shape anisotropy and/or sufficient other magnetic anisotropy to establish stable states of the free layer 214.

The magnetic moment 215 of the free layer 214 is switchable using spin transfer. The magnetic moment 215 is thus shown as a dual headed arrow. In the stable states of the free layer 214, the magnetic moment 215 lies along the easy axis 215 of the free layer. Because it is desired to have a high magnetoresistance, the free layer 214 may include Heusler alloy(s) and/or half metals.

The magnetic junction 200' is also configured such that the free layer 214 has a nonzero initial spin transfer torque even in the absence of thermal fluctuations (i.e. at temperature(s) of the low temperature environment 102). To program the magnetic junction 200', a write current may be driven through the magnetic junction 200' in the current perpendicular-to-plane (CPP) direction. Such a write current has a nonzero initial spin transfer torque for the magnetic junction 200'. This write current is spin polarized due to the magnetic moments 211' and 221' of the reference layers 210' and 218'. The magnetic moment 221' is orthogonal to the free layer easy axis/stable state magnetic moment 215. Thus, at least a portion of the initial spin transfer torque is due to spins polarized parallel or antiparallel to the magnetic moment 221'. These spins correspond to an initial spin transfer torque that is not along the easy axis 215. Consequently, spins polarized by the ferromagnetic layer 220' of the reference layer 218' in, e.g., the +z or −z direction, provide a nonzero initial spin transfer torque on the free layer magnetic moment 215.

Use of the magnetic junction 200' in the quantum computing device magnetic memory 120 allows the storage of data magnetically at the low temperature environment and the benefits of the quantum computing device 100 to be achieved. For example, a higher giant magnetoresistance for the magnetic junction 200' due in part to the material(s) used in the free layer, may facilitate reading of the magnetic memory 120. A lower resistance in the low temperature environment 102, for example due to metallic nonmagnetic spacer layers 212 and 222, also facilitate reading and writing of the magnetic junction 200'. A more balanced shift field due to the SAF reference layer 218' and extended reference layer 210' and a lower magnetic anisotropy for moment in-plane the free layer 214 allow for a lower write current to be used in programming the magnetic junction 200' and thus the memory 120. Further, a nonzero initial spin transfer torque for the free layer 214 in the absence of thermal fluctuations (while exposed to the temperature(s) of the low temperature environment 102 during operation) allows the magnetic junction 200' to be rapidly programmed at the operating temperature(s) of the magnetic memory 120. Thus, the magnetic memory 120 may be appropriate for use in the quantum computing device 100 at least in part through the use of the magnetic junction 200'.

Figure 5:
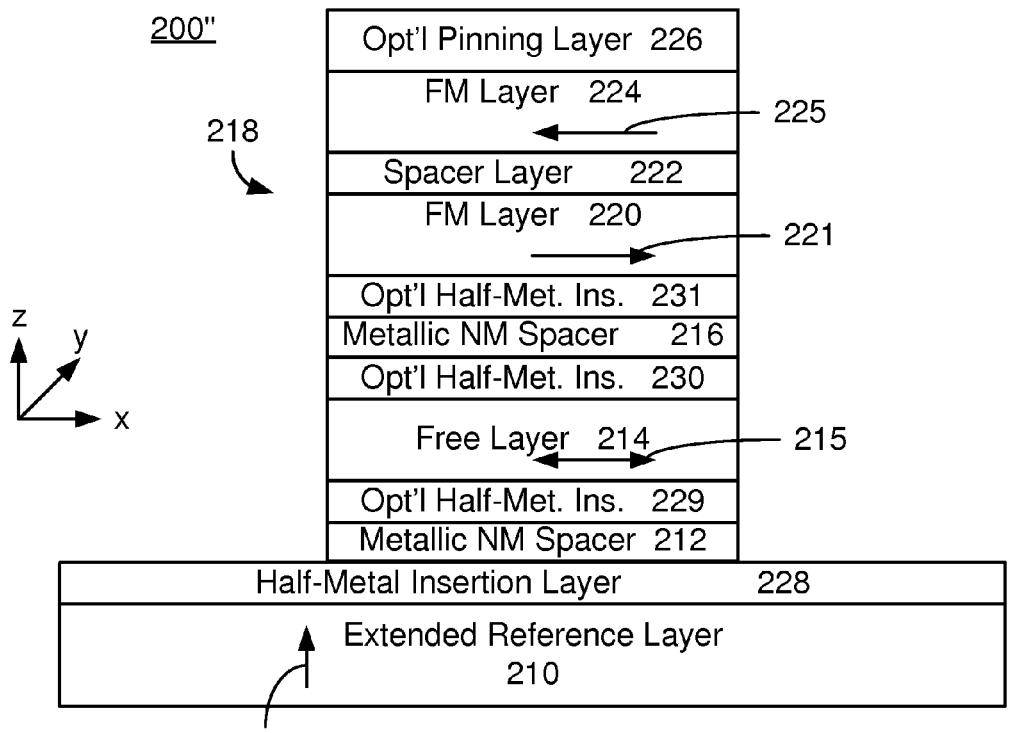
FIG. 5 depicts another exemplary embodiment of a portion of a magnetic memory including a magnetic junction having a free layer with a nonzero initial spin transfer torque at low temperature.

FIG. 5 depicts another exemplary embodiment of a magnetic junction 200" having a free layer with a nonzero initial spin transfer torque at low temperature. For clarity, FIG. 5 is not to scale. The magnetic junction 200" is analogous to the magnetic junctions 200 and/or 200'. Consequently, similar components have corresponding labels. The magnetic junction 200" may be used for the magnetic junction 130 depicted in FIG. 2. Thus, the magnetic junction 200" is for use in a storage cell 124/124' of a quantum computing device magnetic memory 120. The magnetic junction 200" may be used in connection with a quantum processor 110 and may reside in and operate at the low temperature(s) of the low temperature environment 102. Further, the magnetic junction 200" is switchable between stable magnetic states. The magnetic junction 200" is also configured such that the free layer has a nonzero initial writing spin transfer torque in the absence of thermal fluctuations. In some embodiments, the magnetic junction 200" is also configured such that the shift field is substantially balanced at the free layer.

The magnetic junction 200" is an extended orthogonal spin transfer junction including an extended reference layer 210, a nonmagnetic metal spacer layer 212, a free layer 214, an additional nonmagnetic metallic spacer 216, an additional reference layer 218 and an optional pinning layer 226 that are analogous to the reference layer 210, the nonmagnetic metal spacer layer 212, the free layer 214, the additional nonmagnetic metallic spacer 216, the additional reference layer 218 and the optional pinning layer 226, respectively. Thus, the layers 210, 212, 214, 216, 218 and 226 are configured in an analogous manner to the magnetic junction 200. In other embodiments, the layers 210, 212, 214, 216, 218 and 226 might be configured in an analogous manner to the magnetic junction 200'. Stated differently, the reference layer 218 might have magnetic moments orthogonal to the easy axis 215 while the reference layer 210 may have magnetic moment(s) parallel to the easy axis for the magnetic junction 200".

In addition, the magnetic junction 200" includes one or more half metallic insertion layers. In the embodiment shown, a half-metal insertion layer 228 is included in the magnetic junction 200". Optional half-metal insertion layer(s) 229, 230, 231 may be included between the free layer 214 and the metallic spacer 216 and/or between the metallic spacer layer 216 and the ferromagnetic layer 220.

The magnetic junction 200" has analogous benefits to the magnetic junction(s) 200 and/or 200'. In addition, the magnetic junction 200" may have increased magnetoresistance because of the use of one or more of the half-metallic insertion layer(s) 228, 229, 230 and 231. Thus, the magnetic memory 120 may be appropriate for use in the quantum computing device 100 at least in part through the use of the magnetic junction 200'.

Figure 6:
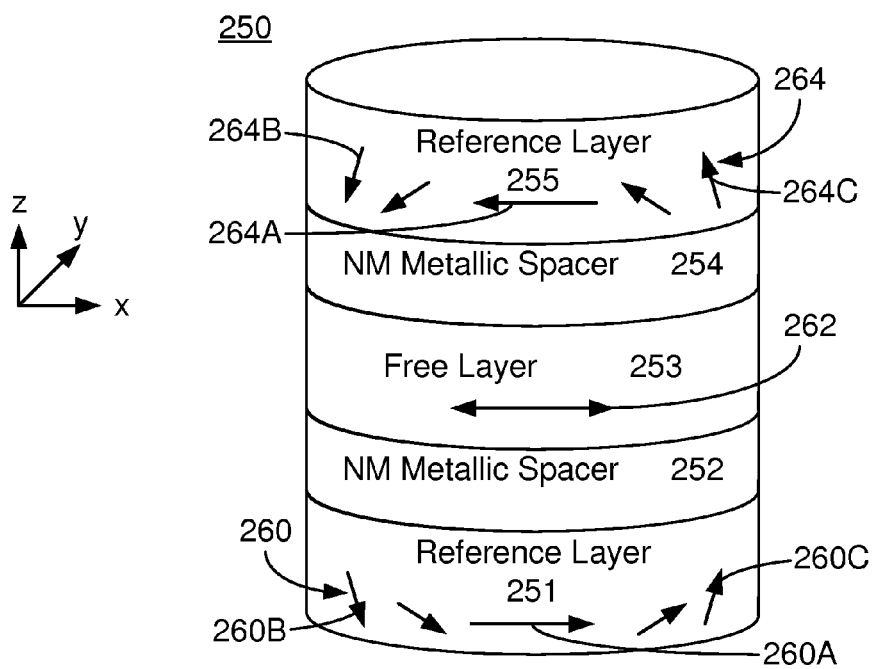
FIG. 6 depicts another exemplary embodiment of a portion of a magnetic memory including a magnetic junction having a free layer with a nonzero initial spin transfer torque at low temperature.

FIG. 6 depicts another exemplary embodiment of a portion of a magnetic memory including a magnetic junction 250 having a free layer with a nonzero initial spin transfer torque at low temperature. For clarity, FIG. 6 is not to scale. The magnetic junction 250 may be used for the magnetic junction 130 depicted in FIG. 2. Thus, the magnetic junction 250 is for use in a storage cell 124/124' of a quantum computing device magnetic memory 120. The magnetic junction 250 may be used in connection with a quantum processor 110 and may reside in and operate at the low temperature(s) of the low temperature environment 102. Further, the magnetic junction 250 is switchable between stable magnetic states. The magnetic junction 250 is also configured such that the free layer has a nonzero initial writing spin transfer torque in the absence of thermal fluctuations. In other words, the magnetic junction 250 has a nonzero initial spin transfer torque for write operations at operating temperatures of the low temperature environment 102. In some embodiments, the magnetic junction is also configured such that the shift field is substantially balanced at the free layer.

The magnetic junction 250 is a spatially varying magnetization reference layer (SVMRL) dual magnetic junction. The magnetic junction 250 includes a reference layer 251, a nonmagnetic metal spacer layer 252, a free layer 253, an additional nonmagnetic metallic spacer 254 and an additional reference layer 255 that are analogous to the reference layer 132, the nonmagnetic spacer layer 133, the free layer 134, the additional nonmagnetic spacer layer 135 and the additional reference layer 136, respectively. For example, the nonmagnetic metal spacer layers 252 and 254 may include materials such as one or more of Ag, AgSn, Cu, Cr and Ge. The magnetic junction 250 may also include optional pinning layers for the reference layers 251 or 255 that are not shown.

As can be seen in FIG. 6, the magnetic moment 262 of the free layer 253 is in-plane and switchable using spin transfer. The magnetic moment 262 is thus shown as a dual headed arrow. In the stable states of the free layer 253, the magnetic moment 262 lies along the easy axis of the free layer. For example, in one stable state the magnetic moment 262 substantially in the +x-direction, but the other stable state is in the −x-direction. The easy axis of the free layer 253 may be considered to be the same as the magnetic moment 262 shown. Because it is desired to have a high magnetoresistance, the free layer 253 may include Heusler alloy(s) and/or half metals.

The reference layers 251 and 255 have spatially varying magnetic moments 260 and 264, respectively. In addition, in the embodiment shown, the reference layers 251 and 255 are self-pinned. In other embodiments, pinning may be achieved in another manner. As can be seen in FIG. 6, the magnetic moment 260 varies across the reference layer 251. For example, closer to the edges, the local magnetic moments 260B and 260C are substantially perpendicular to plane. Closer to the middle of the reference layer 251, the local magnetic moment 260A may be in plane. Similarly, the magnetic moment 264 varies across the reference layer 255. For example, closer to the edges, the local magnetic moments 264B and 264C are substantially perpendicular to plane. Closer to the middle of the reference layer 255, the local magnetic moment 264A may be in plane. Further, the orientations of the local magnetic moments 260B, 260C, 264B and 264C of the reference layers 251 and 255 are such that flux closure may be achieved for the magnetic junction 250. The spatial variation in the magnetic moments 260 and 264 may be achieved by controlling the perpendicular magnetic anisotropy of the layers 251 and 255. In particular, the perpendicular magnetic anisotropy of a layer 251 and/or 255 is greater than sixty percent and less than one hundred percent of the out-of-plane demagnetization energy of the reference layer 251 and/or 255, respectively. In some embodiments, the perpendicular magnetic anisotropy of a layer 251 and/or 255 is greater than eighty-five percent of the out-of-plane demagnetization energy of the reference layer 251 and/or 255, respectively. Thus, materials that may be used for the extended reference layer 251 and/or 255 may include but are not limited to Fe/W multilayers and other materials having high perpendicular anisotropy (perpendicular anisotropy greater than out-of-plane demagnetization energy) might also be used in conjunction with other materials. Further, although shown as single layers, one or both of the reference layers 251 and 255 may be a multilayer including but not limited to a SAF.

Because of the configuration of the reference layers 251 and 255, the shift field due to the reference layers 251 and 255 is substantially balanced at the free layer 253. As can be seen in FIG. 6, the magnetic moments 260 and 264 not only allow for flux closure, but are substantially balanced. Stated differently, the magnetic field at the free layer 253 from the magnetic moment 260 is substantially offset by the magnetic field at the free layer 253 from the magnetic moment 264. The magnetic moment 262 of the free layer 253 is also in-plane. The magnetic anisotropy of the free layer 253 may thus be relatively low. As a result, the write current may be reduced. Note, however, that the magnetic junction may still have a shape anisotropy and/or sufficient other magnetic anisotropy to establish stable states of the free layer 253. For example, as shown in FIG. 6, the magnetic junction 250 may be an ellipse having a long axis parallel to the x-axis and thus the easy axis 262.

The magnetic junction 250 is also configured such that the free layer 253 has a nonzero initial spin transfer torque even in the absence of thermal fluctuations (i.e. at temperature(s) of the low temperature environment 102). To program the magnetic junction 250, a write current may be driven through the magnetic junction 250 in the CPP direction. Such a write current has a nonzero initial spin transfer torque for the magnetic junction 250. This write current is spin polarized due to the magnetic moments 260 and 264 of the reference layers 251 and 255. Because the magnetic moments 260 and 264 spatially vary, the polarization of the current also varies spatially. Portions of the moments 260 and 264, such as 260B, 260C, 264B and 264C, are angled from the easy axis 262. As a result, these local magnetic moments 260B, 260C, 264B and 264C polarize the current near the edges of the junction 250 such that the spins are parallel or antiparallel to the magnetic moments 260B, 260C, 264B and 264C. The spin current passing through these regions are polarized at a nonzero angle from the easy axis 262. These spins correspond to an initial spin transfer torque that is nonzero. Spin polarized current due to local magnetic moments 260A and 264A near the center of the junction 250 may complete STT switching of the free layer 253. Thus, the free layer magnetic moment 262 may not only be switched using STT but also have a nonzero initial spin transfer torque even at low temperatures/in the absence of thermal fluctuations.

Use of the magnetic junction 250 in the quantum computing device magnetic memory 120 allows the storage of data magnetically at the low temperature environment and the benefits of the quantum computing device 100 to be achieved. For example, a higher giant magnetoresistance for the magnetic junction 250 due in part to the material(s) used in the free layer, may facilitate reading of the magnetic memory 120. A lower resistance in the low temperature environment 102, for example due to metallic nonmagnetic spacer layers 252 and 254, also facilitate reading and writing of the magnetic junction 250. A more balanced shift field due to the configuration of the magnetic moments 260 and 264 of the reference layers 251 and 255, respectively, and a lower magnetic anisotropy for moment in-plane the free layer 253 allow for a lower write current to be used in programming the magnetic junction 250 and thus the memory 120. Further, a nonzero initial spin transfer torque for the free layer 253 in the absence of thermal fluctuations (while exposed to the temperature(s) of the low temperature environment 102 during operation) allows the magnetic junction 250 to be rapidly programmed at the operating temperature(s) of the magnetic memory 120. Thus, the magnetic memory 120 may be appropriate for use in the quantum computing device 100 at least in part through the use of the magnetic junction 250.

Figure 7:
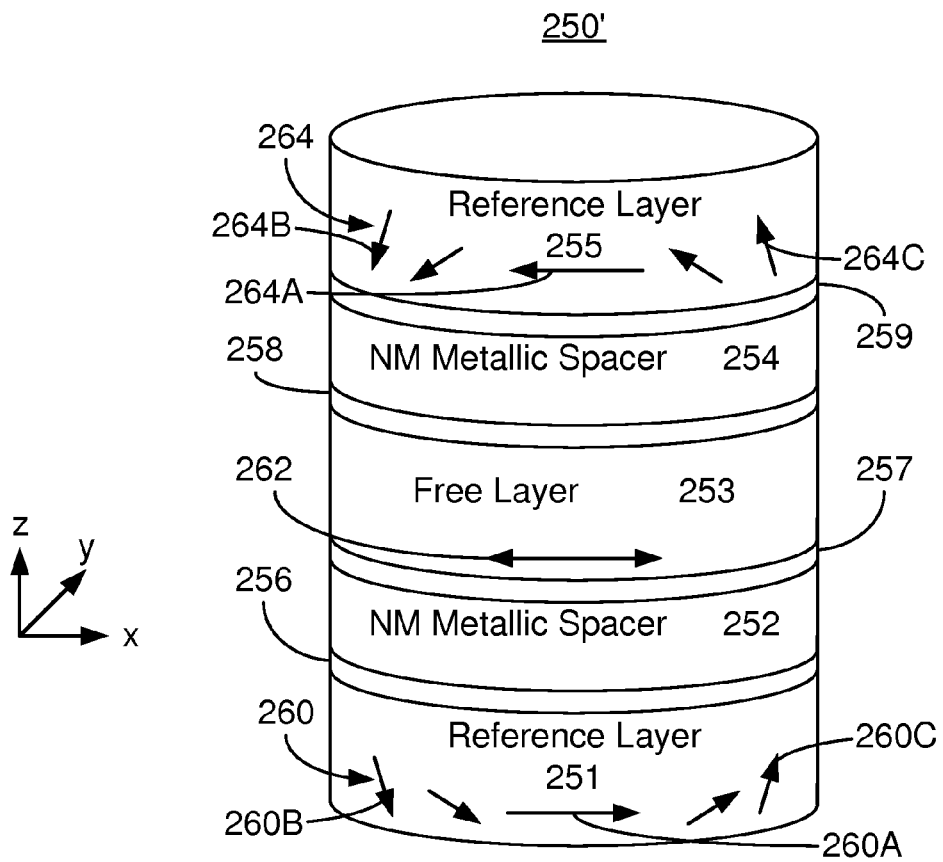
FIG. 7 depicts another exemplary embodiment of a portion of a magnetic memory including a magnetic junction having a free layer with a nonzero initial spin transfer torque at low temperature.

FIG. 7 depicts another exemplary embodiment of a magnetic junction 250' having a free layer with a nonzero initial spin transfer torque at low temperature. For clarity, FIG. 7 is not to scale. The magnetic junction 250' is analogous to the magnetic junction 200. Consequently, similar components have corresponding labels. The magnetic junction 250' may be used for the magnetic junction 130 depicted in FIG. 2. Thus, the magnetic junction 250' is for use in a storage cell 124/124' of a quantum computing device magnetic memory 120. The magnetic junction 250' may be used in connection with a quantum processor 110 and may reside in and operate at the low temperature(s) of the low temperature environment 102. Further, the magnetic junction 250' is switchable between stable magnetic states. The magnetic junction 250' is also configured such that the free layer has a nonzero initial writing spin transfer torque in the absence of thermal fluctuations. In some embodiments, the magnetic junction 250' is also configured such that the shift field is substantially balanced at the free layer.

The magnetic junction 250' is an SVMRL magnetic junction including a reference layer 251, a nonmagnetic metal spacer layer 252, a free layer 253, an additional nonmagnetic metallic spacer 254 and an additional reference layer 255 that are analogous to the reference layer 251, the nonmagnetic metal spacer layer 252, the free layer 253, the additional nonmagnetic metallic spacer 254 and the additional reference layer 255, respectively, shown in FIG. 6. Thus, the layers 251, 252, 253, 254 and 255 are configured in an analogous manner to the magnetic junction 250. For example, the reference layers 251 and 255 have spatially varying magnetizations.

In addition, the magnetic junction 250' includes one or more half metallic insertion layers. In the embodiment shown, optional half-metal insertion layers 256, 257, 258 and 259 are included in the magnetic junction 250' between magnetic layers and adjacent nonmagnetic spacer layers 252 and 254.

The magnetic junction 250' has analogous benefits to the magnetic junction 250. In addition, the magnetic junction 250' may have increased magnetoresistance because of the use of one or more of the half-metallic insertion layer(s) 256, 257, 258 and 259. Thus, the magnetic memory 120 may be appropriate for use in the quantum computing device 100 at least in part through the use of the magnetic junction 250'.

Figure 8:
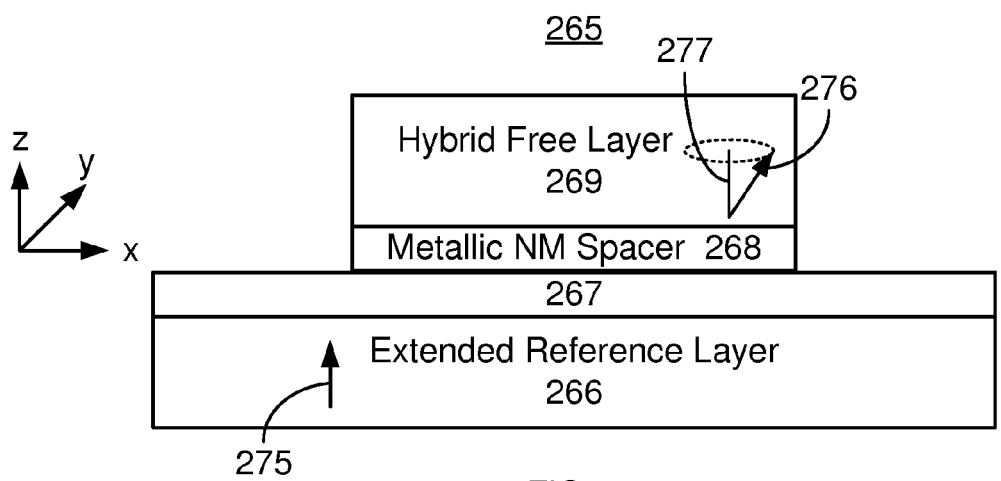
FIG. 8 depicts another exemplary embodiment of a portion of a magnetic memory including a magnetic junction having a free layer with a nonzero initial spin transfer torque at low temperature.

FIG. 8 depicts another exemplary embodiment of a portion of a magnetic memory including a magnetic junction 265 having a free layer with a nonzero initial spin transfer torque at low temperature. For clarity, FIG. 8 is not to scale.

The magnetic junction 265 may be used for the magnetic junction 130 depicted in FIG. 2. Thus, the magnetic junction 265 is for use in a storage cell 124/124' of a quantum computing device magnetic memory 120. The magnetic junction 265 may be used in connection with a quantum processor 110 and may reside in and operate at the low temperature(s) of the low temperature environment 102. Further, the magnetic junction 265 is switchable between stable magnetic states. The magnetic junction 265 is also configured such that the free layer has a nonzero initial writing spin transfer torque in the absence of thermal fluctuations. In other words, the magnetic junction 265 has a nonzero initial spin transfer torque for write operations at operating temperatures of the low temperature environment 102. In some embodiments, the magnetic junction is also configured such that the shift field is substantially balanced at the free layer.

The magnetic junction 265 is a hybrid free layer magnetic junction. The magnetic junction 265 includes a reference layer 266, an optional half-metallic insertion layer 267, a nonmagnetic metal spacer layer 268 and a free layer 269 that are analogous to the reference layer 132, the nonmagnetic spacer layer 133 and the free layer 134, respectively. In other embodiments, an additional nonmagnetic spacer layer and an additional reference layer (not shown) that are analogous to the additional nonmagnetic spacer layer 135 and the additional reference layer 136, respectively, might be included. For example, the nonmagnetic metal spacer layer 268 may include materials such as one or more of Ag, AgSn, Cu, Cr and Ge. The magnetic junction 265 may also include an optional pinning layers for the reference layer 266. Although not shown, optional half-metallic metal layer may be provided between the free layer 269 and the nonmagnetic metallic spacer layer 268.

The reference layer 266 is an extended reference layer analogous to the extended reference layers 210 and/or 210'. Thus, the sidewalls of the extended reference layer 266 extend farther in at least the x-direction (in the plane of the layers) than the sidewalls of the free layer 269 and, in the embodiment shown, than the sidewalls of the remaining portion of the magnetic junction 265. In some embodiments, the sidewalls of the extended reference layer 266 also extend further in the y-direction than the sidewalls of at least the free layer 269. For example, in some embodiments, the layers 68 and 269 have an elliptical cross-section in the x-y plane. The extended reference layer 266 may also have an elliptical-cross section. The cross-section of the extended reference layer 266 has a longer axis in at least the x-direction. In other embodiments, the extended reference layer 266 may be a line, such as the bit line 124. Thus, the extended reference layer 266 may double as part or all of the bit line 124. In such embodiments, the extended reference layer 266 may run in the x-direction.

As can be seen in FIG. 8, the magnetic moment 275 of the extended reference layer 266 is substantially perpendicular to plane. The extended reference layer 266 has a perpendicular magnetic anisotropy that exceeds the out-of-plane demagnetization energy. Thus, materials that may be used for the extended reference layer 266 may include but are not limited to Co/Fe—Pt/Pd multilayer and alloy combinations, Fe/W multilayers, amorphous rare earth materials such as FeTb, CoFeTb, GdFe, GdFeTb, and barium ferrite. Other materials having a high perpendicular anisotropy might also be used.

Because of the configuration of the reference layer 266, the shift field due to the reference layer 266 is substantially balanced at the free layer 269. As discussed above, an extended reference layer such as the reference layer 266 may exert little or no net magnetic field on the free layer 269. As a result, the magnetic anisotropy on the free layer 269 may be lowered and the write current may be reduced.

The free layer 269 is a hybrid free layer because its magnetic moment might be considered to be a hybrid of in plane and perpendicular to plane. The magnetic moment 276 of the free layer 269 is thus canted from the perpendicular direction 277 that is parallel to the magnetic moment 275 of the extended reference layer 266. In some embodiments, this direction 275 is also the direction of the easy axis. The hybrid free layer 269 may be achieved in a number of ways. In some embodiments, the free layer 269 may include ferromagnetic sublayers that are exchange coupled. Some of such sublayers may have their magnetic moment in-plane, while other of the sublayers have their moment perpendicular to plane. The net moment of the free layer 269 is then canted from perpendicular to plane but also not in-plane. In other embodiments, the free layer 269 may be a layer configured to have an easy cone anisotropy. An easy cone anisotropy is an anisotropy for which the stable magnetic state(s) of the free layer are at an angle around a particular, symmetry axis. This possibility is denoted by the dotted line around the axis 277 in FIG. 8. In some embodiments, such an anisotropy may be a combination of uniaxial and biaxial anisotropies. For example, the magnetic anisotropy energy of the free layer 269 may be given as a function of angle from a particular direction 277 by:

$E(\theta) = K_{uni} \sin^2(\theta) + K_{bi} \sin^2(2\theta)$ where $\theta$ is the angle from direction 277

The $K_{uni} \sin^2(\theta)$ term ("uniaxial term") corresponds to a uniaxial magnetic anisotropy. The $K_{bi} \sin^2(2\theta)$ term ("biaxial term") corresponds to a biaxial anisotropy. If the biaxial term is zero, the free layer 269 would have a uniaxial anisotropy. A uniaxial anisotropy has an energy minimum along the axis direction 277. These directions are parallel and antiparallel to the magnetization (not shown) of the reference layer 275 and correspond to stagnation points for spin transfer torque and for field torque. At a spin transfer torque stagnation point, the spin polarized current initially exerts little or no torque on the magnetization of the free layer 269.

If the uniaxial term is zero, then the anisotropy energy of for the free layer 269 in the example above is the biaxial term. The free layer 269 would have a biaxial anisotropy only. As a result, the energy minima (the stable states of the free layer 269) would be both along and perpendicular to the uniaxial easy axis direction ($\theta=0$, $\pi/2$, and $\pi$). These directions are parallel, perpendicular, and antiparallel to the magnetization (not shown) of the reference layer 266.

If there is some biaxial anisotropy in addition to the uniaxial anisotropy, the uniaxial energy curve is perturbed by the biaxial term ($K_{bi} \sin^2(2\theta)$). As the magnitude of the biaxial term in the magnetic anisotropy energy is further increased, the uniaxial energy curve is further perturbed. Because of the introduction of a larger biaxial term, the energy curve has minima at an angle between the symmetry axis 277 and in-plane. The energy curve is symmetric around the symmetry axis (angle is zero). The magnetic anisotropy of the free layer 269 may be termed a cone anisotropy and is the combination of a uniaxial anisotropy and a biaxial anisotropy. The larger spread in the initial states of the free layer 269 may mean that the magnetization of the free layer 269 is more likely to be at a small angle, or canted, from the symmetry axis 277. In other words, the magnetization of the free layer 269 is more likely to be at an angle other than zero degrees from the axis 277. Thus, the stable states for the magnetization 276 of the free layer 269 is more likely to be away from the stagnation points for spin transfer torque. In other words, the free layer 269 may have a nonzero initial spin transfer torque even in the absence of thermal fluctuations (e.g. at the temperatures of the low temperature environment 102). Thus, the free layer magnetic moment 276 may not only be switched using STT but also have a nonzero initial spin transfer torque even at low temperatures/in the absence of thermal fluctuations.

Because the free layer 269 is a hybrid free layer, the free layer 269 has nonzero initial spin transfer torque in the absence of thermal fluctuations (e.g. in the operating temperatures of the low temperature environment 102). The free layer magnetic moment 276 may be a multilayer in which at least some portion of the sublayers have their magnetic moments substantially in-plane. Such magnetic moments experience a nonzero initial spin transfer torque for a current that is spin polarized by the magnetic moment 275 of the extended reference layer 266. The free layer 269 may also have an easy cone anisotropy, for example for a single layer. In such embodiments, the free layer 269 magnetic moment 276 is stable an angle from the direction 277. Consequently, the spin carriers polarized by the magnetic moment 275 are not aligned with the magnetic moment 276. Again, the spin polarized current exerts a nonzero initial spin transfer torque for the free layer 269. Consequently, STT switching of the free layer 269 may be more readily achieved in the low temperature environment 102.

Use of the magnetic junction 265 in the quantum computing device magnetic memory 120 allows the storage of data magnetically at the low temperature environment and the benefits of the quantum computing device 100 to be achieved. A lower resistance in the low temperature environment 102, for example due to metallic nonmagnetic spacer layer 268, also facilitates reading and writing of the magnetic junction 265. A more balanced shift field may be achieved because the reference layer 266 is an extended reference layer. This may allow for a lower write current to be used in programming the magnetic junction 265 and thus the memory 120. Further, a nonzero initial spin transfer torque for the free layer 269 in the absence of thermal fluctuations (while exposed to the temperature(s) of the low temperature environment 102 during operation) allows the magnetic junction 265 to be rapidly programmed at the operating temperature(s) of the magnetic memory 120. Thus, the magnetic memory 120 may be appropriate for use in the quantum computing device 100 at least in part through the use of the magnetic junction 265.

Figure 9:
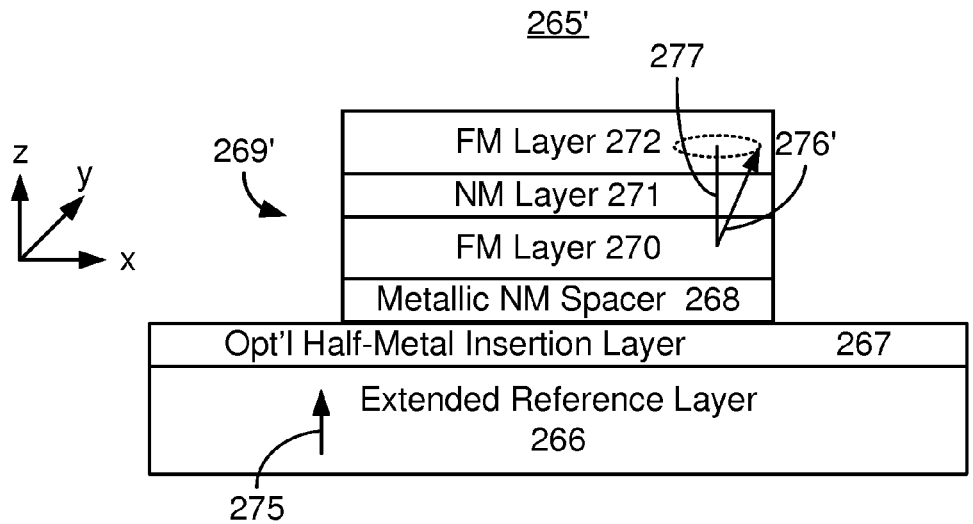
FIG. 9 depicts another exemplary embodiment of a portion of a magnetic memory including a magnetic junction having a free layer with a nonzero initial spin transfer torque at low temperature.

FIG. 9 depicts another exemplary embodiment of a magnetic junction 265' that has a free layer with a nonzero initial spin transfer torque at low temperature. For clarity, FIG. 9 is not to scale. The magnetic junction 265' is analogous to the magnetic junction 265. Consequently, similar components have corresponding labels. The magnetic junction 265' may be used for the magnetic junction 130 depicted in FIG. 2. Thus, the magnetic junction 265' is for use in a storage cell 124/124' of a quantum computing device magnetic memory 120. The magnetic junction 265' may be used in connection with a quantum processor 110 and may reside in and operate at the low temperature(s) of the low temperature environment 102. Further, the magnetic junction 265' is switchable between stable magnetic states. The magnetic junction 265' is also configured such that the free layer has a nonzero initial writing spin transfer torque in the absence of thermal fluctuations. In some embodiments, the magnetic junction 265' is also configured such that the shift field is substantially balanced at the free layer.

The magnetic junction 265' is a hybrid free layer magnetic junction including a reference layer 266, an optional half-metal insertion layer 267, a nonmagnetic metal spacer layer 268 and a free layer 269' that are analogous to the reference layer 266, the optional half-metal insertion layer 267, the nonmagnetic metal spacer layer 268 and the free layer 269, respectively, shown in FIG. 8. Thus, the layers 266, 267, 268 and 269' are configured in an analogous manner to the magnetic junction 265.

In addition, the free layer 269' explicitly includes multiple ferromagnetic layer 270 and 272 separated by and coupled through a nonmagnetic layer 271. The nonmagnetic layer 271 may be a metallic material such as Ru and is sufficiently thin that the layers 270 and 272 are exchange coupled through the layer 271. Further, the magnetic moments (not shown) of the layers 270 and 272 are orthogonal. One magnetic moment is in plane, while the other is perpendicular to plane (in the absence of magnetic coupling between the layers 270 and 272). As a result, the net magnetic moment of the free layer 269' is canted from the perpendicular-to-plane direction 277. Thus, the free layer 269' is configured to have a nonzero initial spin transfer torque.

The magnetic junction 265' has analogous benefits to the magnetic junction 265. A lower resistance in the low temperature environment 102, for example due to metallic nonmagnetic spacer layer 268, also facilitates reading and writing of the magnetic junction 265'. A more balanced shift field may be achieved because the reference layer 266 is an extended reference layer. This may allow for a lower write current to be used in programming the magnetic junction 265' and thus the memory 120. Further, a nonzero initial spin transfer torque for the free layer 269' in the absence of thermal fluctuations (while exposed to the temperature(s) of the low temperature environment 102 during operation) allows the magnetic junction 265 to be rapidly programmed at the operating temperature(s) of the magnetic memory 120. Thus, the magnetic memory 120 may be appropriate for use in the quantum computing device 100 at least in part through the use of the magnetic junction 265'.

Figure 10:
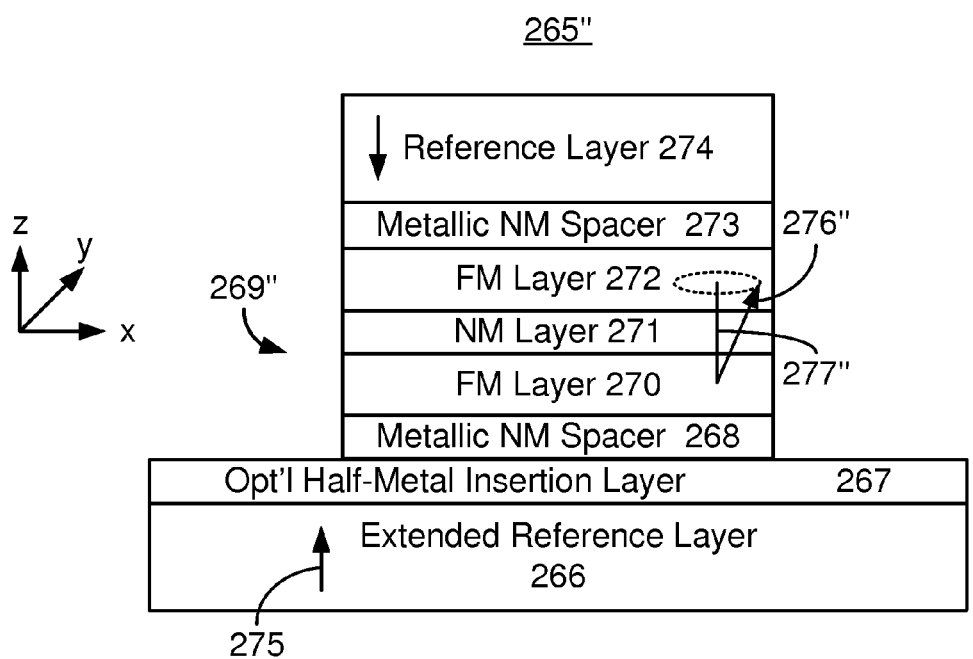
FIG. 10 depicts another exemplary embodiment of a portion of a magnetic memory including a magnetic junction having a free layer with a nonzero initial spin transfer torque at low temperature.

FIG. 10 depicts another exemplary embodiment of a magnetic junction 265" that has a free layer with a nonzero initial spin transfer torque at low temperature. For clarity, FIG. 10 is not to scale. The magnetic junction 265" is analogous to the magnetic junction(s) 265 and 265'. Consequently, similar components have corresponding labels. The magnetic junction 265" may be used for the magnetic junction 130 depicted in FIG. 2. Thus, the magnetic junction 265" is for use in a storage cell 124/124' of a quantum computing device magnetic memory 120. The magnetic junction 265" may be used in connection with a quantum processor 110 and may reside in and operate at the low temperature(s) of the low temperature environment 102. Further, the magnetic junction 265" is switchable between stable magnetic states. The magnetic junction 265" is also configured such that the free layer has a nonzero initial writing spin transfer torque in the absence of thermal fluctuations. In some embodiments, the magnetic junction 265" is also configured such that the shift field is substantially balanced at the free layer.

The magnetic junction 265" is a hybrid free layer magnetic junction including a reference layer 266, an optional half-metal insertion layer 267, a nonmagnetic metal spacer layer 268 and a free layer 269' that are analogous to the reference layer 266, the optional half-metal insertion layer 267, the nonmagnetic metal spacer layer 268 and the free layer 269/269', respectively, shown in FIGS. 8-9. Thus, the layers 266, 267, 268 and 269' are configured in an analogous manner to the magnetic junctions 265 and/or 265'. For example, although the free layer 269' is depicted as a multilayer including layers 270, 271 and 272, in other embodiments, the free layer 269' may be a single layer hybrid free layer.

In addition, the magnetic junction 265" also include an additional nonmagnetic metallic spacer layer 273 and an additional reference layer 274. The layers 273 and 274 are analogous to the layers 135 and 136, respectively. The magnetic junction 265" is, therefore, not only a hybrid free layer magnetic junction but also a dual magnetic junction.

The magnetic junction 265" has analogous benefits to the magnetic junction 265 and/or 265'. A lower resistance in the low temperature environment 102, for example due to metallic nonmagnetic spacer layer 268, also facilitates reading and writing of the magnetic junction 265". A more balanced shift field may be achieved because the reference layer 266 is an extended reference layer. This may allow for a lower write current to be used in programming the magnetic junction 265" and thus the memory 120. Further, a nonzero initial spin transfer torque for the free layer 269' in the absence of thermal fluctuations (while exposed to the temperature(s) of the low temperature environment 102 during operation) allows the magnetic junction 265" to be rapidly programmed at the operating temperature(s) of the magnetic memory 120. Thus, the magnetic memory 120 may be appropriate for use in the quantum computing device 100 at least in part through the use of the magnetic junction 265".

Figure 11:
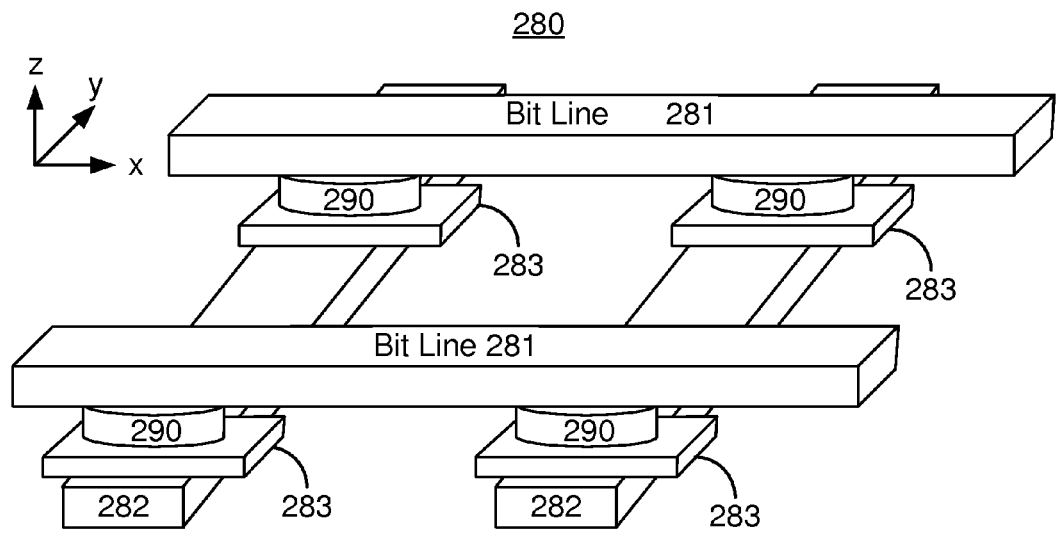
FIG. 11 depicts another exemplary embodiment of a portion of a magnetic memory including a magnetic junction having a free layer with a nonzero initial spin transfer torque at low temperature.

FIG. 11 depicts an exemplary embodiment of a portion of a magnetic memory 280 that includes magnetic junctions having a free layer with a nonzero initial spin transfer torque at low temperature. For clarity, FIG. 11 is not to scale. The magnetic memory 280 may be used for the magnetic memory 120 depicted in FIG. 1. Thus, the magnetic memory 280 includes magnetic junctions 290 that may be used in a storage cell 124/124' of a quantum computing device magnetic memory 120. The magnetic memory 280 may be used in connection with a quantum processor 110 and may reside in and operate at the low temperature(s) of the low temperature environment 102. Further, the magnetic junction 290 is switchable between stable magnetic states. The magnetic junction 290 is also configured such that the free layer has a nonzero initial writing spin transfer torque in the absence of thermal fluctuations. In other words, the magnetic junction 290 has a nonzero initial spin transfer torque for write operations at operating temperatures of the low temperature environment 102. In some embodiments, the magnetic junction 290 is also configured such that the shift field is substantially balanced at the free layer.

The magnetic memory 280 utilizes a cross point architecture. In particular, the magnetic memory 280 includes bit lines 281 corresponding to the bit lines 122 depicted in FIG. 1, word lines 282 and magnetic junctions 290 that are located where the word lines 282 and bit lines 281 cross. The magnetic junctions 290 selected for reading and/or writing are within the region(s) at which the selected bit line(s) 281 and word line(s) cross. The magnetic junction 290 to be written or read is selected based upon a combination of the voltage(s) applied and/or current(s) driven through the lines 281 and 282. Only where the desired conditions are applied for both lines 281 and 282 (e.g. at the cross-point) is the magnetic junction 290 programmed or read. In other words, selection of the magnetic junction(s) 290 is based on the cross-point(s) of the selected lines 281 and 282. In some embodiments, a selection transistor (not shown) is coupled with each region 283 and may be used to selectively connect the magnetic junction 290 to ground.

In some embodiments, the magnetic junctions 290 may be programmed using a magnetic field that is at an angle of greater than zero degrees from the easy axis of the free layers (not shown in FIG. 11) of the magnetic junctions 290. For example, suppose the easy axis of the free layers of the magnetic junctions 290 is along the x-axis. Thus, the stable magnetic states for the magnetic junctions 290 would be with the free layer magnetic moment in the positive x-direction and in the negative x-direction. In such an embodiment, the magnetic field may be applied by driving write currents through a selected bit line 281 and through a selected word line 282. A sufficient field canted from the x-axis would be generated only for the magnetic junction 290 located in the region where the selected bit line 281 and the selected word line 282 cross. Further, because the magnetic field is applied at a nonzero angle from the easy axis (canted from the x-axis), the field is considered to be applied away from the stagnation point for the magnetic junction 290. Consequently, the magnetic junction 290 is considered to have a nonzero initial spin transfer torque. In other embodiments, the cross-points selected and, therefore, the magnetic junction(s) 290 selected to be written or read may be determined in other manners. For example, a spin polarized current may be driven in proximity or through the desired magnetic junction 290 (with nonzero initial spin transfer torque) based on the cross-point architecture.

The magnetic junction 290 may be configured in a manner similar to the magnetic junction 130. For example, the free layer may be desired to have a balanced shift field and/or a low magnetic anisotropy to facilitate writing. The nonmagnetic spacer layer(s) may be metallic in order to provide the desired resistance in the low temperature environment 102. Materials that enhance magnetoresistance, such as have metals and/or Heusler alloys, may also be used. Further, as discussed above, the magnetic junction is configured to have a nonzero initial spin transfer torque.

In addition, the magnetic memory 280 may include spin-orbit coupling (SO) lines 283. The SO lines 283 may be used. The SO lines 283 have a strong spin-orbit interaction and can be used in switching the magnetic moment of the free layer of the magnetic junction 290. A current is driven in plane through the SO line 283 may result in a spin-orbit torque on the magnetic junction, as is discussed below. Such a torque may be used to assist in switching the magnetic junctions 290.

Use of the magnetic memory 280 in the quantum computing device magnetic memory 120 allows the storage of data magnetically at the low temperature environment and the benefits of the quantum computing device 100 to be achieved. The lower resistance, giant magnetoresistance, low anisotropy and nonzero initial spin transfer torque for the magnetic junction 290 facilitate use of the magnetic memory 280 in the quantum computing device 100.

Figure 12A:
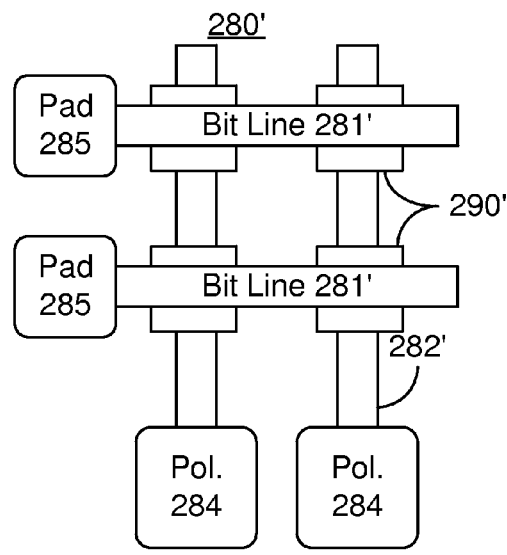
FIGS. 12A-12B depict another exemplary embodiment of a portion of a magnetic memory including a magnetic junction having a free layer with a nonzero initial spin transfer torque at low temperature.
Figure 12B:
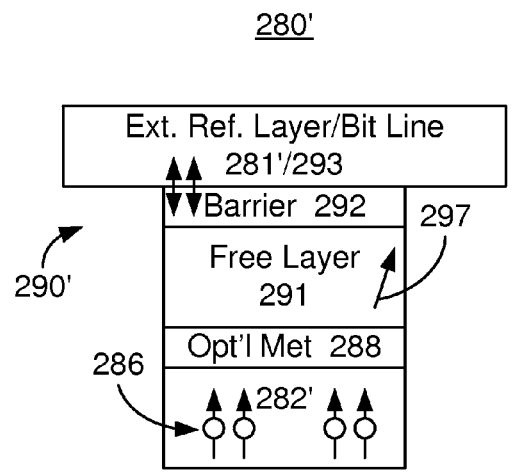

FIGS. 12A-12B depict another exemplary embodiment of a magnetic memory 280' having a cross-point architecture and having a free layer with a nonzero initial spin transfer torque at low temperature. For clarity, FIGS. 12A-12B are not to scale. FIG. 12A depicts a plan view, while FIG. 12B depicts a side view. The magnetic memory 280' is analogous to the magnetic memory 280 and thus the quantum computing device magnetic memory 120. Consequently, similar components have corresponding labels. The magnetic memory includes bit lines 281', word lines 282', and magnetic junctions 290' that are analogous to the bit lines 281, word lines 282 and magnetic junctions 290. The magnetic junction 290' may be used for the magnetic junction 130 depicted in FIG. 2 and the magnetic junction 290 depicted in FIG. 11. Thus, the magnetic junction 290' is for use in a storage cell 124/124' of a quantum computing device magnetic memory 120. The magnetic junction 290' may be used in connection with a quantum processor 110 and may reside in and operate at the low temperature(s) of the low temperature environment 102. Further, the magnetic junction 290' is switchable between stable magnetic states. The magnetic junction 290' is also configured such that the free layer has a nonzero initial writing spin transfer torque in the absence of thermal fluctuations. In some embodiments, the magnetic junction 290' is also configured such that the shift field is substantially balanced at the free layer.

In addition to the magnetic junctions 290' and lines 281' and 282', the memory 280' also includes contact pads 285 and polarizers 284. The contact pads 285 allow electrical connection to be made to the bit lines 281'. The polarizers 284 are magnetic polarizers which polarize the current in the direction of the magnetic moment of the polarizers 284. For example, if the magnetic moment of the polarizers 284 is out of the plane of the page in FIG. 12A, a current driven from the bottom to the top of the page is polarized with spins oriented into the plane of the page while a current driven from the top of the pages is polarized with the spins oriented out of the plane of the page. In some embodiments, the polarizers 284 may be ferromagnetic layer(s) residing adjacent to the lines 282'. Materials for the polarizers 284 may include ferromagnetic materials Fe, Co, and Ni; alloy(s) of Fe, Co, and/or Ni; alloy(s) of the Fe, Co and/or Ni with a non-magnetic material, and/or multilayers of the ferromagnetic material(s) Fe, Co and/or Ni and nonmagnetic spacer layers. The nonmagnetic material(s) used in the alloy(s) may include B, Ta, W, Hf, Ti, Cr, V, Mg, Be, Zr, Nb, Mo, Pd, Pt, Re and/or Rh. The lines 282' may also be desired to have a long spin diffusion length to preserve the spin information from the polarizers 284. Because the spin diffusion length increases with decreasing temperature, high conductivity material(s) such as Cu may have a sufficiently high spin diffusion length in the low temperature environment 102. Although one polarizer per line 282' is shown, in some embodiments, multiple polarizers 284 per line 282' may be used.

The magnetic junction 290' includes an extended reference layer 293 that is also the bit line 281' in the embodiment shown, a nonmagnetic barrier spacer layer 292 and a free layer 291. Also shown are an optional metal layer 288 and the word line 282'. Because the reference layer 293 is an extended reference layer, the sidewalls of the extended reference layer 210' extend farther in at least one direction in the plane of the layers than the sidewalls of the free layer 291. The optional metal layer 288 may be a high conductivity layer, such as Cu, between the word line 282' and the free layer 291. The magnetic junction 290' also includes barrier layer 292, which may be crystalline MgO for enhanced magnetoresistance. Materials for 284 layer may include ferromagnetic materials Fe, Co, Ni, alloy of these materials, alloy of the above materials and non-magnetic material X=B, Ta, W, Hf, Ti, Cr, V, Mg, Be, Zr, Nb, Mo, Pd, Pt, Re, Rh or multilayers of FM materials and non-magnetic spacers.

The magnetic junction 290' is a voltage controlled anisotropy magnetic junction because the free layer 291 has a voltage controlled magnetic anisotropy. Stated differently if a voltage is applied to the free layer 291 the magnetic anisotropy may be increased or reduced. In some embodiments, a voltage developed between the free layer 291 and the bit line 281' may reduce the magnetic anisotropy of the free layer 291. The reduction in the magnetic anisotropy destabilizes a current stable magnetic state of the free layer 291. For example, the easy axis of the free layer 291 may be perpendicular-to-plane. The stable states of the free layer magnetic moment are with the magnetic moment oriented toward the top of the page and with the magnetic moment oriented toward the bottom of the page. This condition is shown in FIG. 12B, which depicts the magnetic moment 297 of the free layer 291 as being canted from perpendicular to plane. As long as the voltage is not applied to the free layer 291 and the free layer 291 is not programmed, the magnetic state of the free layer 291' is stable.

The magnetic junction 290' is selected based on the cross-point architecture and the conditions in the selected bit line 281' and the word line 282'. To program the magnetic junction 290' a voltage is applied to the desired bit line(s) 281' and a current driven in plane through the selected word line(s) 282'. As discussed above, the magnetic junction 290' is a voltage controlled anisotropy magnetic junction. The presence of the barrier layer 292 may prevent a current from being driven through the magnetic junction 290' in the CPP direction when a voltage is applied to the line 281'/293. However, a voltage may be developed across the barrier layer 292. This voltage reduces the anisotropy of the free layer 291 and allows the free layer magnetic moment to be canted from perpendicular to plane. This situation is shown in FIG. 12B, where magnetic moment 297 is canted from perpendicular to plane. In addition, a current is driven in plane (to/from the top of the page in FIG. 12A and into/out of the plane of the page in FIG. 12B) through the line 282'. The polarizing elements 284 polarize the spin current carriers 286, for example as shown in FIG. 12B. The presence of the barrier layer 292 may prevent current from being driven in the CPP direction through the magnetic junction 290'. However, the spin polarized current passes through the line 282' in proximity to the selected magnetic junction 290'. The spin current carriers 286 may still transmit their spin information to the free layer 291. The current through the word line 282' may be used to switch the magnetic moment 297 of the free layer 291. Further, because the free layer magnetic anisotropy has been reduced by the voltage and the magnetic moment 297 may be canted as shown, the spin current carriers 286 have their spins oriented at a nonzero angle from the free layer magnetic moment 297. Thus, the spin current carriers 286 may do so with a nonzero initial spin transfer torque. Note that although the term "spin transfer torque" is used, a current may not be driven through the magnetic junction 290'. Thus, as used herein, a nonzero initial spin transfer torque includes other spin torques that are nonzero initially. Note that the orientations of the spin current carriers 286 and free layer magnetic moment 297 depend upon the voltage controlled anisotropy and magnetization direction of the polarizers 284 rather than on temperature. Thus, this nonzero initial spin transfer torque may be achieved in the absence of thermal fluctuations. Through the combination of the voltage controlled anisotropy and the spin current through the lines 282', the desired magnetic junction(s) 290' may be programmed. For those magnetic junction through which either the voltage applied to the line 281' or the current through the line 282' is missing, programming is not performed. Thus, only magnetic junction(s) 290' at the selected cross-point(s) may be switched. For reading the desired magnetic junction 290', a current is driven through the magnetic junction 290' in the CPP configuration in order to determine the magnetoresistance of the magnetic junction 290'. This read current is only driven between the selected line(s) 282' and 284' to enable reading of the desired magnetic junction(s) 290' at the cross-points.

Use of the magnetic memory 280' and the magnetic junction 290' as the quantum computing device magnetic memory 120 and magnetic junction 130 allows the storage of data magnetically at the low temperature environment and the benefits of the quantum computing device 100 to be achieved. For example, a more balanced shift field due to the extended reference layer 293/281' may allow for a lower write current to be used in programming the magnetic junction 290' and thus the memory 120. Further, a nonzero initial spin transfer torque for the free layer 291 in the absence of thermal fluctuations (while exposed to the temperature(s) of the low temperature environment 102 during operation) allows the magnetic junction 290' to be rapidly programmed at the operating temperature(s) of the magnetic memory 120/280'. Thus, the magnetic memory 280' may be appropriate for use in the quantum computing device 100.

Figure 13A:
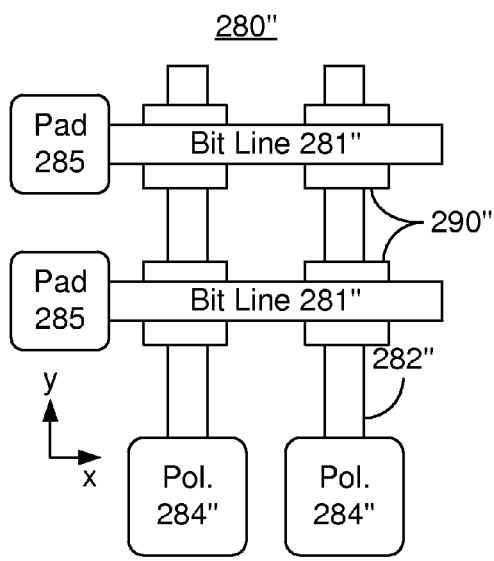
FIG. 13A-13B depict another exemplary embodiment of a portion of a magnetic memory including a magnetic junction having a free layer with a nonzero initial spin transfer torque at low temperature.
Figure 13B:
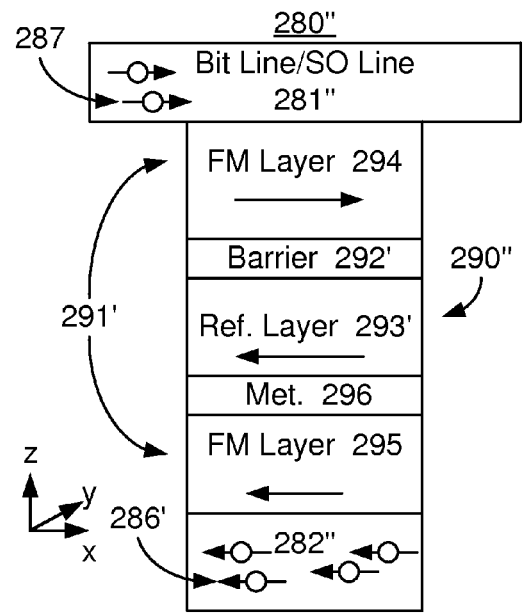

FIGS. 13A-13B depict another exemplary embodiment of a magnetic memory 280" having a cross-point architecture and having a free layer with a nonzero initial spin transfer torque at low temperature. For clarity, FIGS. 13A-13B are not to scale. FIG. 13A depicts a plan view, while FIG. 13B depicts a side view. The magnetic memory 280" is analogous to the magnetic memory 280 and/or 280'. The magnetic memory 280" is also analogous to the quantum computing device magnetic memory 120. Consequently, similar components have corresponding labels. The magnetic memory includes bit lines 281", word lines 282", polarizers 284', pads 285 and magnetic junctions 290" that are analogous to the bit lines 281/281', word lines 282/282', polarizers 284, pads 285 and magnetic junctions 290/290', respectively. The magnetic junction 290' may be used for the magnetic junction 130 depicted in FIG. 2 and the magnetic junction 290 depicted in FIG. 11. Thus, the magnetic junction 290" is for use in a storage cell 124/124' of a quantum computing device magnetic memory 120. The magnetic junction 290" may be used in connection with a quantum processor 110 and may reside in and operate at the low temperature(s) of the low temperature environment 102. Further, the magnetic junction 290" is switchable between stable magnetic states. The magnetic junction 290" is also configured such that the free layer has a nonzero initial writing spin transfer torque in the absence of thermal fluctuations. In some embodiments, the magnetic junction 290" may also be also configured such that the shift field is substantially balanced at the free layer.

As discussed below, the lines 282" and 281" carry a spin polarized current. In some embodiments, the line 282" is a spin-orbit coupling (SO) line. In other embodiments, the line 282" may be a high conductivity line carrying a current that is spin polarized by the polarizers 284'. Similarly, in some embodiments, the line 281" is a SO line. In other embodiments, the line 281" may be a high conductivity line carrying a current that is spin polarized by polarizers (not shown). As discussed below, an SO line includes material(s) having a strong spin-orbit coupling and which generates a spin-orbit (SO) field. This field may be achieved by driving a current through the SO line. The magnitude of the field is proportional to the current density. The SO field is analogous to spin transfer torque and can switch the magnetic junction 290" as discussed below. Thus, spin transfer torque and SO torque may be used interchangeably herein.

The magnetic junction 290" includes a reference layer 293', a nonmagnetic barrier spacer layer 292' and a split free layer 291'. Also shown is word line 282". An optional metal layer (not shown) may be provided between the word line 282" and the layer 295 of the free layer 291'.

The free layer 291' is a split free layer including ferromagnetic layers 294 and 295. Thus, the reference layer 293' is between ferromagnetic layers 294 and 295 and is separated from the ferromagnetic layer 294 and 295 by the barrier layer 292' and the metallic spacer layer 296. The barrier layer 292' may include crystalline MgO. Note that the magnetic moments and, in some embodiments, thicknesses of the layers 294 and 295 may differ. For example, the thicker layer 294 may have a higher magnetic moment as shown in FIG. 13B. The magnetic moments of the layers 294 and 295 are also antiferromagnetically coupled by a magnetostatic field and in plane. Both magnetically stable states of the free layer 291' are depicted. In one stable state, the moment of the ferromagnetic layer 294 points to the right while the moment of the ferromagnetic layer 295 points to the left. In the other stable state, the moment of the ferromagnetic layer 294 points to the left while the moment of the ferromagnetic layer 295 points to the right. For simplicity, only the case in which the magnetic moment of the layer 294 points to the right and the magnetic moment of the layer 295 points to the left are shown.

The magnetic junction 290" is selected based on the cross-point architecture and the conditions in the selected bit line 281" and the word line 282". In the embodiment shown, the word line 282" and the bit line 281" carry a spin polarized current for programming the magnetic junction 290". Thus, current carriers 286' and 287 in one case are shown in FIG. 13B. The magnetic junction 290" is programmed only when spin polarized currents having their spins polarized in opposite directions are carried in the lines 282" and 281". Such a case is depicted in FIG. 13B. If the current carriers 286' and 287 are spin polarized shown, the magnetic junction at the cross point(s) of the line(s) 281" and 282" is programmed in the state depicted in FIG. 13B. If the current carriers 286' and 287 were spin polarized in opposite directions, the magnetic junction 290" would be programmed in the other stable magnetic state. If only the line 281" or only the line 282" but not both, the magnetic junction 290" at the cross-point would not be programmed. Note that the current in the lines 281" and 282" does not pass through the magnetic junction 290" during programming. However, spin information may still be transferred from the lines 281" and 282" to the magnetic junction 290". Thus, the magnetic junction 290" may be programmed based on the spin polarized current carried by lines 281" and 282" and the cross-point architecture.

The magnetic junction 290" may also be configured such that the free layer 291" has a nonzero initial spin transfer torque even in the absence of thermal fluctuations (i.e. at temperature(s) of the low temperature environment 102). The magnetic junction 290" may thus address issues due to stagnation. The in-plane easy axis of the free 291' layer can be located at an angle with respect to the SO lines 281". For example, the cells 290" may be patterned such that their long axis is at a nonzero angle from the direction of the SO lines 281". Such a configuration allows for a nonzero initial SO torque on the free layer 291'. Further, there may be flux closure for the layers 294 and 295 of the free layer 291'. As a result, the magnetic moments of the layers 294 and 295 may be tilted near the edges. Thus, these portions of the free layer 291' undergo a nonzero initial spin transfer torque. The stagnation point issues may thus be addressed for both spin transfer and SO torques.

As discussed above, the magnetic junction 290" may also have the shift field being substantially balanced at the free layer 291'. For a single layer reference layer 293', the field is not compensated for at the individual sublayers 294 and 295. Because the reference layer 293' is between the layer 294 and 295 of the free layer 291', the shift field is compensated for the free layer 291' as a whole. In some embodiments, the reference layer 293' may include multiple sublayers. For example, the reference layer 293' may include magnetic layers interleaved with nonmagnetic layer(s) such that the magnetic layer(s) are antiferromagnetically coupled. Thus, the reference layer 293' may be a SAF. In such embodiments, the shift magnetic fields at the individual sublayers 294 and 295 as well as for the free layer 291' entire be compensated for.

In order to read the magnetic junction 290", a current is driven in the CPP configuration through the magnetic junction 290". The magnetoresistance of the barrier layer 292' dominates the resistance of the magnetic junction 290". Thus, the state of the magnetic junction 290" may be determined based upon the directions of the moments of the reference layer 293' and the ferromagnetic layer 294.

Use of the magnetic memory 280" and the magnetic junction 290' as the quantum computing device magnetic memory 120 and magnetic junction 130 allows the storage of data magnetically at the low temperature environment and the benefits of the quantum computing device 100 to be achieved. For example, a nonzero initial spin transfer torque (nonzero initial SO torque) for the free layer 291' in the absence of thermal fluctuations (while exposed to the temperature(s) of the low temperature environment 102 during operation) allows the magnetic junction 290" to be rapidly programmed at the operating temperature(s) of the magnetic memory 120/280". Thus, the magnetic memory 280" may be appropriate for use in the quantum computing device 100.

Figure 14:
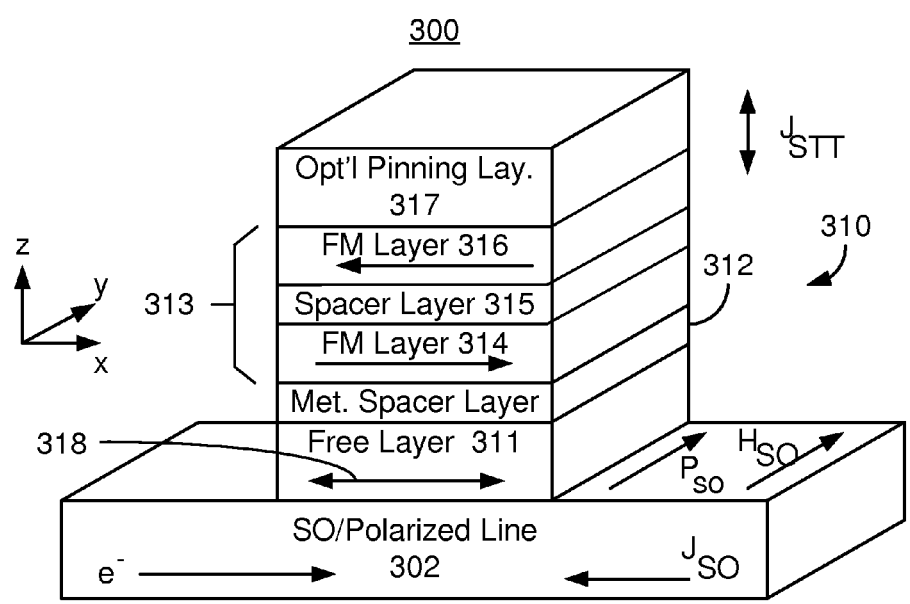
FIG. 14 depicts another exemplary embodiment of a portion of a magnetic memory including a magnetic junction having a free layer with a nonzero initial spin transfer torque at low temperature.

FIG. 14 depicts another exemplary embodiment of a portion of a magnetic memory 300 having a free layer with a nonzero initial spin transfer torque at low temperature. For clarity, FIG. 14 is not to scale. The magnetic memory 300 includes magnetic junction 310, which may be used for the magnetic junction 130 depicted in FIG. 2. Thus, the magnetic junction 310 is for use in a storage cell 124/124' of a quantum computing device magnetic memory 120. The magnetic memory 300 may be used in connection with a quantum processor 110 and may reside in and operate at the low temperature(s) of the low temperature environment 102. Further, the magnetic junction 310 is switchable between stable magnetic states. The magnetic junction 310 is also configured such that the free layer has a nonzero initial spin transfer torque in the absence of thermal fluctuations. In other words, the magnetic junction 310 has a nonzero initial spin transfer torque for write operations at operating temperatures of the low temperature environment 102. In some embodiments, the magnetic junction is also configured such that the shift field is substantially balanced at the free layer.

The magnetic junction 310 includes a free layer 311, a nonmagnetic spacer layer 312 that may be a metal or an insulating barrier layer, a reference layer 313 and an optional pinning layer 317 that may be analogous to the free layer 134, the nonmagnetic spacer layer 133, the reference layer 132 and the optional pinning layer 137, respectively. For example, the nonmagnetic metal spacer layers 312 may include materials such as one or more of Ag, AgSn, Cu, Cr and Ge. Because it is desired to have a high magnetoresistance, the free layer 311 may include Heusler alloy(s) and/or half metals. The free layer magnetic moment is in plane and may be stable along the easy axis 318 (e.g. in the positive direction or negative x direction) shown in FIG. 14.

The reference layer 313 is a SAF including ferromagnetic layers 314 and 316 sandwiching nonmagnetic layer 315. The magnetic moments of the ferromagnetic layers 314 and 316 are antiferromagnetically coupled. Because of this coupling the shift field due to the reference layer 313 is substantially balanced at the free layer 311. The magnetic moment of the free layer 311 is also in-plane. The magnetic anisotropy of the free layer 311 may thus be relatively low. As a result, the write current may be reduced. Note, however, that the magnetic junction may still have a shape anisotropy and/or sufficient other magnetic anisotropy to establish stable states of the free layer 311. For example, although shown as a rectangle, the cross section of the magnetic junction 310 in the x-y plane may be an ellipse having a long axis parallel to the x-axis.

The free layer is switched using a spin polarized current driven through the line 302. The spin polarized current may be an SO current. Consequently, the terms spin polarized current and SO current may be used interchangeably for the magnetic memory 300. The SO line 302 may be a bit line corresponding to the line 122. In some embodiments, the SO line 302 may be a high conductivity line which is connected to one or more polarizers. Thus, the SO line 302 may be analogous to the line 282'. In other embodiments, the SO line 302 includes material(s) that have a high SO coupling. For example, the line 302 may include Pt, Ta, W, Bi and/or alloys of these materials. The SO line 302 may be used in generating a spin-orbit field $H_{SO}$. More specifically, a current, $J_{SO}$, is driven in plane through the SO line 302. Note that electrons may move in the opposite direction to the current, as shown in FIG. 14. Due to the spin-orbit interaction in the SO line 302, the current flowing through this layer may result in the spin-orbit field $H_{SO}$ proportional to the current density $J_{SO}$. For some embodiments, the spin-orbit field $H_{SO}$ is parallel to a vector $p_{SO}$, which is determined by the material parameters and geometry of the SO line 302 and by the direction of the current $J_{SO}$. For some other embodiments $H_{SO}$ is parallel to a vector $[M \times p_{SO}]$, where M is vector of the magnetic moment of the free layer 311. For some other embodiments it is proportional to a linear combination of the vectors $[M \times p_{SO}]$ and Pso. This spin-orbit field $H_{SO}$ is equivalent to the spin-orbit torque, $T_{SO}$, on the free layer magnetic moment. The spin-orbit torque on the free layer 311 is given by $T_{SO} = -\gamma[M \times H_{SO}]$. This mutually correlated torque and field are thus interchangeably referred to herein as spin-orbit field and spin-orbit torque. This reflects the fact that the spin-orbit interaction is the origin of the spin-orbit torque and spin-orbit field. Note that spin-orbit torque occurs for a current driven in plane through in the SO line 302 and a spin-orbit interaction. In contrast, spin transfer torque technically occurs for a current driven in the CPP direction through the magnetic junction 310. In the embodiment shown, the spin transfer torque is due to the current density $J_{STT}$. The spin-orbit torque $T_{SO}$ may rapidly deflect the magnetic moment of the free layer 311 from its equilibrium state parallel to the easy axis. The current flowing through the SO line 302 may have very large current density because the current is in plane. This current density for the SO line 302 may be larger than the current density which flows through the magnetic junction 310 as the latter is limited by the size of the cell transistor (if any). Therefore, the spin-orbit torque generated by $J_{SO}$ can be significantly larger than the maximum STT torque generated by the current flowing through the magnetic junction 310. As a result, the spin-orbit torque may tilt the magnetization of the free layer 311 considerably faster than conventional STT torque. In some embodiments, another mechanism such as spin transfer may be used to complete switching. In other embodiments, switching can be completed using spin-orbit torque. The spin-orbit field/spin-orbit torque generated may thus be used in switching the magnetic moment of the free layer 311.

In some embodiments, the SO interaction may include some combination of two effects: the spin Hall effect and the Rashba effect. In many SO active layers, the spin-orbit interaction includes both the spin Hall effect and the Rashba effect, but one of the two dominates. Other spin-orbit effects may also be employed. The spin Hall effect is generally considered to be a bulk effect. Typically for the spin Hall effect the vector $p_{SO}$ at a given surface of the SO line 302 is directed perpendicular to the direction of the current and to the normal vector to that surface. Materials that exhibit the spin Hall effect often include heavy metals or materials doped by heavy metals. For example, such materials can be selected from at least one of A and M doped by B. A includes Y, Zr, Nb, Mo, Tc, Ru, Rh, Pd, Cd, In, Sb, Te, Hf, Ta (including high-resistive amorphous β-Ta), W, Re, Os, Ir, Pt, Au, Hg, Tl, Pb, Bi, Po, At, and/or their combinations; M includes at least one of Al, Ti, V, Cr, Mn, Cu, Zn, Ag, Hf, Ta, W, Re, Pt, Au, Hg, Pb, Si, Ga, GaMn or GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb. In some embodiments, the SO line 302 may include or consist of Ir doped Cu and/or Bi doped Cu. The doping is generally in the range of 0.1 through 10 atomic percent. In other embodiments, other materials may be used.

Another source of the spin-orbit field $H_{SO}$ in the SO line 302 can be related to the spin-orbit interaction at the interfaces. The magnitude of the spin-orbit field in this case is often related to the magnitude of the crystal field, which is often high at the interface. Due to the mismatch of the lattice parameters of the adjacent layers, the presence of heavy metals at the interface, and other effects, the spin-orbit interaction can be considerably large at some interfaces. A strong spin-orbit effect at the interface associated with the gradient of the crystal field in the perpendicular to the interface plane direction is often referred to as the Rashba effect. As used herein, however, the Rashba effect refers to a spin-orbit interaction at the interface regardless of its origin and direction. Note that in at least some embodiments, the interfaces for the SO line 302 should differ to get a sizable Rashba affect. For example, the Rashba effect may occur for the SO line 302 being/having a Pt layer adjoining the magnetic junction 310 and a Co layer for the free layer 311. In some embodiments, other materials may be used.

The unit vector of spin-polarization for the Rashba effect is typically perpendicular to the crystal field and the current direction. Many SO line 302 have a crystal field perpendicular to the plane of the layer 302. As such, the spin-orbit polarization would be in plane, for example in the direction of $H_{SO}$ in FIG. 14. Alternatively, the SO line 302 may have a crystalline field in plane or tilted to the plane. As such, the SO line 302 has a spin-orbit polarization perpendicular to plane (not shown in FIG. 14) or correspondingly tilted to the plane (not shown in FIG. 14). In such embodiments, the SO line 302 may include a surface alloy. For example the SO line 302 may include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and/or their combinations. In other embodiments, the SO line 302 may include surface alloys of A/B, e.g. atoms of A residing on a (111) surface of a host material B such that on the top atomic layers are a mixture of A and B. A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and B includes at least one of Si, Zn, Cu, Ag, Au, W, Zn, Cr, Pt, Pd. In many embodiments, A includes two or three different materials. In some embodiments, at least 0.1 to not more than three monolayers of A are deposited. In some such embodiments approximately ⅓ of a monolayer of A is deposited. In some embodiments, this can be one or more of substitutional Bi/Ag, substitutional Pb/Ag, substitutional Sb/Ag, substitutional Bi/Si, substitutional Ag/Pt, substitutional Pb/Ge, substitutional Bi/Cu, and a bilayer including a layer residing on a (111) surface of Au, Ag, Cu or Si. In other embodiments, the SO line 302 may include compounds like InGaAs, HgCdTe or bilayers $LaAlO_3/SrTiO_3$, $LaTiO_3/SrTiO_3$. In other embodiments, other materials may be used. For some embodiments, Rashba effect would result in the spin-orbit torque $T_{SO}$ and corresponding spin-orbit field $H_{SO}$ on the free layer 311. The SO torque on the magnetic junction 310 may thus be a combination of one or more of the spin Hall effect, the Rashba effect and/or other analogous effect.

Thus, the magnetic memory 300 may use spin-orbit interaction and the spin-orbit field generated by the SO line 302 in switching of the magnetic moment of the free layer 311. The spin-orbit (SO) torque can exert a torque on the magnetic moment of the data storage/free layer 311. This SO torque can be used in switching the magnetic moment of the free layer 311. In some embodiments, the SO torque assists in switching the magnetic moment of the free layer 311. Another mechanism, such as spin transfer torque, is the primary switching mechanism. In other embodiments, the spin-orbit torque is the primary switching mechanism for the magnetic moment of the free layer 311. However, in some such embodiments, the spin-orbit torque may be assisted by another mechanism such as spin transfer torque. The assistance may be in switching the magnetic moment of the free layer 311 and/or in selecting the magnetic junction to be switched.

The magnetic junction 310 is also configured such that the free layer 311 has a nonzero initial spin transfer torque (and/or SO torque) even in the absence of thermal fluctuations (i.e. at temperature(s) of the low temperature environment 102). To program the magnetic junction 310, a write current may be driven through SO line 302 in plane as shown. This generates an SO torque that rapidly deflects the magnetic moment of the free layer 311 even in the absence of thermal fluctuations. In some embodiments, a write current is also driven the magnetic junction 310 in the CPP direction. Because of the deflection due to the SO torque the CPP write current has a nonzero initial spin transfer torque for the magnetic junction 310. Alternatively, the SO torque may be used to complete switching of the free layer magnetic moment 318. However, in such embodiments, the initial SO torque is still at a nonzero angle from the free layer magnetic moment 318. Thus, a nonzero initial SO torque is applied during writing. This nonzero initial SO torque is considered to be equivalent to a nonzero initial spin transfer torque discussed above. Thus, for both switching mechanisms, the magnetic junction 310 is configured for the free layer 311 to have a nonzero initial spin transfer torque for writing.

Use of the magnetic memory 300 in the quantum computing device magnetic memory 120 allows the storage of data magnetically at the low temperature environment and the benefits of the quantum computing device 100 to be achieved. For example, a higher giant magnetoresistance for the magnetic junction 310 due in part to the material(s) used in the free layer, may facilitate reading of the magnetic memory 120. A lower resistance in the low temperature environment 102, for example due to metallic nonmagnetic spacer layer 312, also facilitate reading and writing of the magnetic junction 200. A more balanced shift field due to the SAF reference layer 313 and/or a lower magnetic anisotropy for moment in-plane the free layer 311 allow for a lower write current to be used in programming the magnetic junction 310 and thus the memory 300/120. Further, a the magnetic junction 310 has a nonzero initial spin transfer torque for the free layer 311 in the absence of thermal fluctuations due to the SO torque from the SO line 302. This allows the magnetic junction 310 to be rapidly programmed at the operating temperature(s) of the magnetic memory 120. Thus, the magnetic memory 300/120 may be appropriate for use in the quantum computing device 100.

Figure 15:
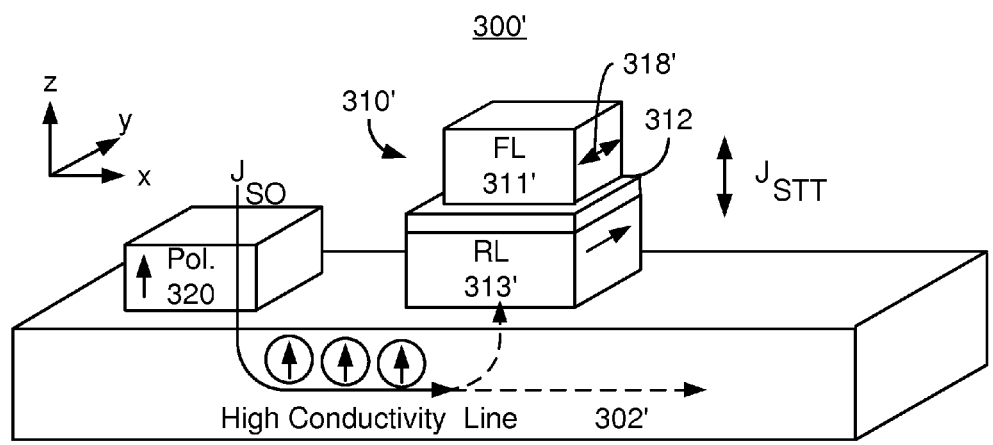
FIG. 15 depicts another exemplary embodiment of a portion of a magnetic memory including a magnetic junction having a free layer with a nonzero initial spin transfer torque at low temperature.

FIG. 15 depicts another exemplary embodiment of a magnetic memory 300' having a free layer with a nonzero initial spin transfer torque at low temperature. For clarity, FIG. 15 is not to scale. The magnetic memory 300' is analogous to the magnetic memory 300. Consequently, similar components have corresponding labels. The magnetic memory 300' thus includes magnetic junction 310' and line 302' that are analogous to the magnetic junction 310 and the line 302, respectively. Also shown is a polarizer 320. The magnetic junction 310' may be used for the magnetic junction 130 depicted in FIG. 2. Thus, the magnetic junction 310' is for use in a storage cell 124/124' of a quantum computing device magnetic memory 120. The magnetic junction 310' may be used in connection with a quantum processor 110 and may reside in and operate at the low temperature(s) of the low temperature environment 102. Further, the magnetic junction 310' is switchable between stable magnetic states. The magnetic junction 310' is also configured such that the free layer has a nonzero initial writing spin transfer torque in the absence of thermal fluctuations. In some embodiments, the magnetic junction 310' is also configured such that the shift field is substantially balanced at the free layer.

The magnetic junction 310' is an extended spin transfer junction including an optionally extended reference layer 313', a nonmagnetic spacer layer 312 and a free layer 311 that are analogous to the reference layer 313, the nonmagnetic spacer layer 312 and free layer 311, respectively. Although additional layers are not shown, the magnetic junction 310' may be a dual magnetic junction in other embodiments. The reference layer 313' may optionally be an extended reference layer, in this case the sidewalls of the extended reference layer 313' extend farther in at least one direction in the plane of the layers than the sidewalls of the free layer 311'. In the embodiment shown, the sidewalls of the extended reference layer 313' extend further than the sidewalls of the remaining portion of the magnetic junction 310'.

The free layer 311' is analogous to the free layer depicted in FIG. 14 and has a magnetic moment 318' that is in-plane. For the stable states of the free layer 311', the magnetic moment lies along the easy axis 318' of the free layer 311'. Because it is desired to have a high magnetoresistance, the free layer 311' may include Heusler alloy(s) and/or half metals. The magnetic moment of the extended reference layer 313' is also in-plane. Because the reference layer 313' extends beyond the remainder of the magnetic junction 310', the shift field due to the reference layer 313' may be substantially balanced at the free layer 311. The magnetic anisotropy of the free layer 311' may thus be relatively low. As a result, the write current may be reduced. Note, however, that the magnetic junction may still have a shape anisotropy and/or sufficient other magnetic anisotropy to establish stable states of the free layer 311'.

The magnetic moment 318' of the free layer 311' is switchable using spin transfer torque and/or SO torque due to the polarizer 320. As can be seen in FIG. 15, an in-plane current, corresponding to current density $J_{SO}$, is driven through the line 302'. The current corresponding to $J_{SO}$ may be considered an SO current because it flows in plane through the line 302'. The line 302' may be a high conductivity line having a long spin diffusion length in the low temperature environment 102. For example, Cu or another analogous high conductivity material may be used. The long spin diffusion length allows the polarization provided by the polarizer 320 to be preserved at least to the magnetic junction 310'. However, material(s) with shorter spin diffusion lengths might also be used. In other embodiments, the line 302' may include or consist of an SO material as discussed above for the memory 300.

The magnetic memory 300' is also configured such that the free layer 311' has a nonzero initial spin transfer torque even in the absence of thermal fluctuations (i.e. at temperature(s) of the low temperature environment 102). To program the magnetic junction 310', the current is driven through the polarizer 320 and the line 302'. This current is polarized perpendicular to the easy axis 318' of the free layer 311'. In some embodiments, this current is driven through the line 302' but not through the magnetic junction 310'. In other embodiments, the current corresponding to $J_{SO}$ may be driven through the magnetic junction 310'. Thus, the current path is shown by two different dashed arrows around the magnetic junction 310'. Depending on the geometrical and material parameters, one of these current paths will correspond to enhanced SO-induced spin accumulation near the reference layer 313'. The accumulation of the spin polarized current carriers near the reference layer 313' may exert a torque on the reference layer 313'. This torque is nonzero because the polarization of the current carriers is set by the polarizer 320 and is thus perpendicular-to-plane. Due to this torque, the magnetic moment of the reference layer 313' would be quickly tilted from its equilibrium state. The stray field from the reference layer the reference layer 313' on the free layer 311' will thus rapidly change, which would result in a deflection of the free layer 311' from its equilibrium position, in the opposite direction to the tilt of the reference layer 313'. In order to complete the switching, the traditional spin transfer due to the current density $J_{STT}$ directed in the CPP direction is applied. Since the free layer is deflected from the equilibrium position, the torque acting on the free layer will be non-zero even in the absence of thermal fluctuations. Thus the magnetic junction 310' and magnetic memory 300' are configured such that the magnetic junction 310' is switchable with a nonzero initial spin transfer torque in the absence of thermal fluctuations.

Use of the magnetic memory 300' as the quantum computing device magnetic memory 120 allows the storage of data magnetically at the low temperature environment and the benefits of the quantum computing device 100 to be achieved. For example, a higher giant magnetoresistance for the magnetic junction 310' due in part to the material(s) used in the free layer, may facilitate reading of the magnetic memory 120. A lower resistance in the low temperature environment 102, for example due to nonmagnetic spacer layer 312, also facilitates reading and writing of the magnetic junction 310'. A more balanced shift field due to the extended reference layer 313' and a lower magnetic anisotropy for moment in-plane the free layer 311' allow for a lower write current to be used in programming the magnetic junction 310' and thus the memory 120/300'. Further, a nonzero initial spin transfer torque for the free layer 311' in the absence of thermal fluctuations (while exposed to the temperature(s) of the low temperature environment 102 during operation) allows the magnetic junction 310' to be rapidly programmed at the operating temperature(s) of the magnetic memory 120. Thus, the magnetic memory 300'/120 may be appropriate for use in the quantum computing device 100.

Figure 16:
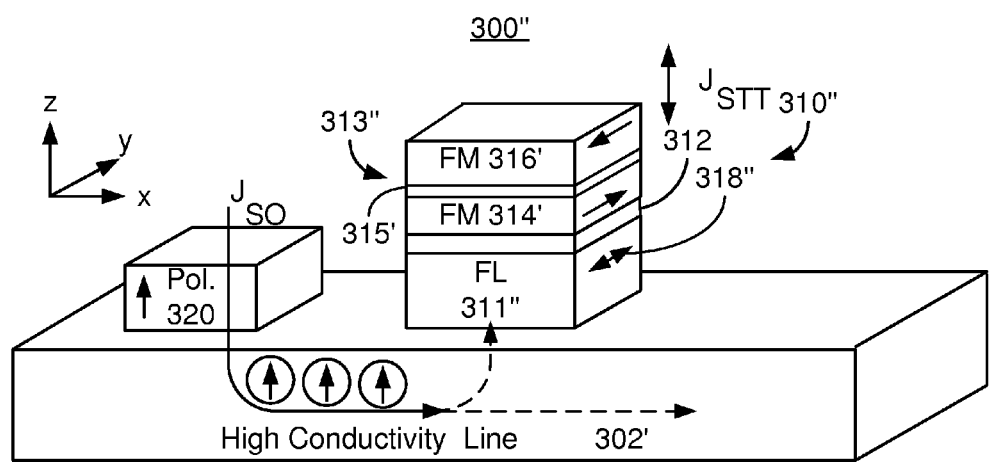
FIG. 16 depicts another exemplary embodiment of a portion of a magnetic memory including a magnetic junction having a free layer with a nonzero initial spin transfer torque at low temperature.

FIG. 16 depicts another exemplary embodiment of a magnetic memory 300" having a free layer with a nonzero initial spin transfer torque at low temperature. For clarity, FIG. 16 is not to scale. The magnetic memory 300" is analogous to the magnetic memory 300 and/or 300'. Consequently, similar components have corresponding labels. The magnetic memory 300" thus includes magnetic junction 310', and line 302' and polarizer 320 that are analogous to the magnetic junction 310/310', the line 302/302' and the polarizer 320, respectively. The magnetic junction 310" may be used for the magnetic junction 130 depicted in FIG. 2. The magnetic junction 310'" may be used in connection with a quantum processor 110 and may reside in and operate at the low temperature(s) of the low temperature environment 102. Further, the magnetic junction 310" is switchable between stable magnetic states. The magnetic junction 310" is also configured such that the free layer has a nonzero initial writing spin transfer torque in the absence of thermal fluctuations. In some embodiments, the magnetic junction 310" is also configured such that the shift field is substantially balanced at the free layer.

The magnetic memory 300" operates in an analogous manner to the magnetic memory 300'. The free layer 311" is analogous to the free layer depicted in FIG. 14 and has a magnetic moment 318" that is in-plane. For the stable states of the free layer 311", the magnetic moment lies along the easy axis 318" of the free layer 311". Because it is desired to have a high magnetoresistance, the free layer 311" may include Heusler alloy(s) and/or half metals. However the free layer 311" is between the line 302' and the reference layer 313". Further, the reference layer 313" is a SAF including ferromagnetic layers 314' and 316' separated by nonmagnetic layer 315'. Thus, the layer 313" is more analogous to the reference layer 313 than the reference layer 313'. Because the reference layer 313" is a SAF, however, the shift field due to the reference layer 313" may still be substantially balanced at the free layer 311". The magnetic anisotropy of the free layer 311" may thus be relatively low. As a result, the write current may be reduced. Note, however, that the magnetic junction may still have a shape anisotropy and/or sufficient other magnetic anisotropy to establish stable states of the free layer 311".

The free layer 311" may be switched using a combination of spin torque due to the current corresponding to $J_{SO}$ and a spin transfer due to the current corresponding to the current density $J_{STT}$. Further, the current corresponding to $J_{SO}$ may be driven through the magnetic junction 310" or may bypass the magnetic junction 310". For reasons analogous to those discussed above for the memory 300', spin polarized current carriers may accumulate near the free layer 311" and exert a torque on the free layer 311". This torque is nonzero because the polarization of the current carriers is set by the polarizer 320 and is thus perpendicular-to-plane. Due to this torque, the magnetic moment of the free layer 311" may be perturbed from the equilibrium state. Switching of the free layer 311" may be completed via spin transfer. Thus, the magnetic memory 300" is also configured such that the free layer 311" has a nonzero initial spin transfer torque even in the absence of thermal fluctuations (i.e. at temperature(s) of the low temperature environment 102).

The magnetic memory 300" may have benefits analogous to those described above for the magnetic memory 300'. In particular, the magnetic memory 300" may allow rapid storage of data magnetically at the low temperature environment with a read signal in a desired range and the benefits of the quantum computing device 100 to be achieved. Thus, the magnetic memory 300"/120 may be appropriate for use in the quantum computing device 100.

Figure 17:
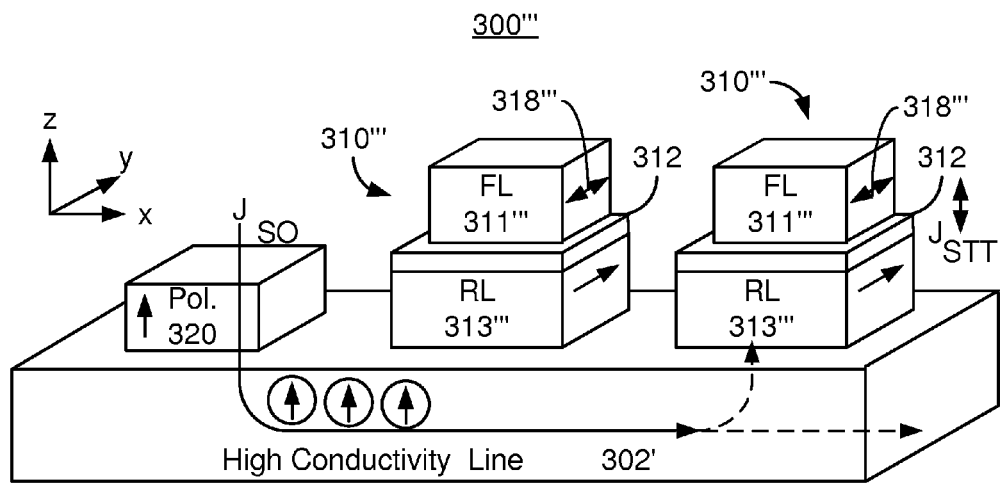
FIG. 17 depicts another exemplary embodiment of a portion of a magnetic memory including a magnetic junction having a free layer with a nonzero initial spin transfer torque at low temperature.

FIG. 17 depicts another exemplary embodiment of a magnetic memory 300''' having a free layer with a nonzero initial spin transfer torque at low temperature. For clarity, FIG. 17 is not to scale. The magnetic memory 300''' is analogous to the magnetic memory 300, 300' and/or 300". The magnetic memory 300''' is, however, most analogous to the memory 300'. Consequently, similar components have corresponding labels. The magnetic memory 300''' thus includes magnetic junction 310''', and line 302' and polarizer 320 that are analogous to the magnetic junction 310/310'/310", the line 302/302' and the polarizer 320, respectively. The magnetic junction 310''' may be used for the magnetic junction 130 depicted in FIG. 2. The magnetic junction 310''' may be used in connection with a quantum processor 110 and may reside in and operate at the low temperature(s) of the low temperature environment 102. Further, the magnetic junction 310''' is switchable between stable magnetic states. The magnetic junction 310''' is also configured such that the free layer has a nonzero initial writing spin transfer torque in the absence of thermal fluctuations. In some embodiments, the magnetic junction 310''' is also configured such that the shift field is substantially balanced at the free layer.

The magnetic memory 300''' operates in an analogous manner to the magnetic memory 300'/300". The free layer 311''' is analogous to the free layers 311, 311' and 311" and has a magnetic moment 318''' that is in-plane. For the stable states of the free layer 311''', the magnetic moment lies along the easy axis 318''' of the free layer 311'''. Because it is desired to have a high magnetoresistance, the free layer 311''' may include Heusler alloy(s) and/or half metals. Further, the reference layer 313''' may optionally be an extended reference layer analogous to the reference layer 313'. Because the reference layer 313''' may be an extended reference layer, the shift field due to the reference layer 313''' at the free layer 311''' may be better controlled. However, a small shift field may be desired to aid in tilting of the free layer magnetic moment 318'''. The magnetic anisotropy of the free layer 311''' may still be relatively low. As a result, the write current may be reduced. Note, however, that the magnetic junction may still have a shape anisotropy and/or sufficient other magnetic anisotropy to establish stable states of the free layer 311'''.

As discussed above with respect to the memories 300' and 300", the free layer 311''' may be switched using a combination of spin torque due to the current corresponding to $J_{SO}$ and a spin transfer due to the current corresponding to the current density $J_{STT}$. Further, the current corresponding to $J_{SO}$ may be driven through the magnetic junction 310''' or may bypass the magnetic junction 310'''. For reasons analogous to those discussed above for the memories 300' and 300", the magnetic memory 300''' is also configured such that the free layer 311''' has a nonzero initial spin transfer torque even in the absence of thermal fluctuations (i.e. at temperature(s) of the low temperature environment 102).

In addition, as can be seen in FIG. 17, the line 302' has a spin diffusion length that is sufficiently high that the polarizer 320 may be located further from the magnetic junction 310''' being programmed. Thus, a single polarizer 320 may serve multiple magnetic junctions 310'''. However, only magnetic junctions 310''' that are selected, for example by having the current corresponding to $J_{STT}$ driven through them, are written.

The magnetic memory 300''' may have benefits analogous to those described above for the magnetic memories 300, 300' and/or 300". In particular, the magnetic memory 300''' may allow rapid storage of data magnetically at the low temperature environment with a read signal in a desired range and the benefits of the quantum computing device 100 to be achieved. Thus, the magnetic memory 300'''/120 may be appropriate for use in the quantum computing device 100.

Figure 18:
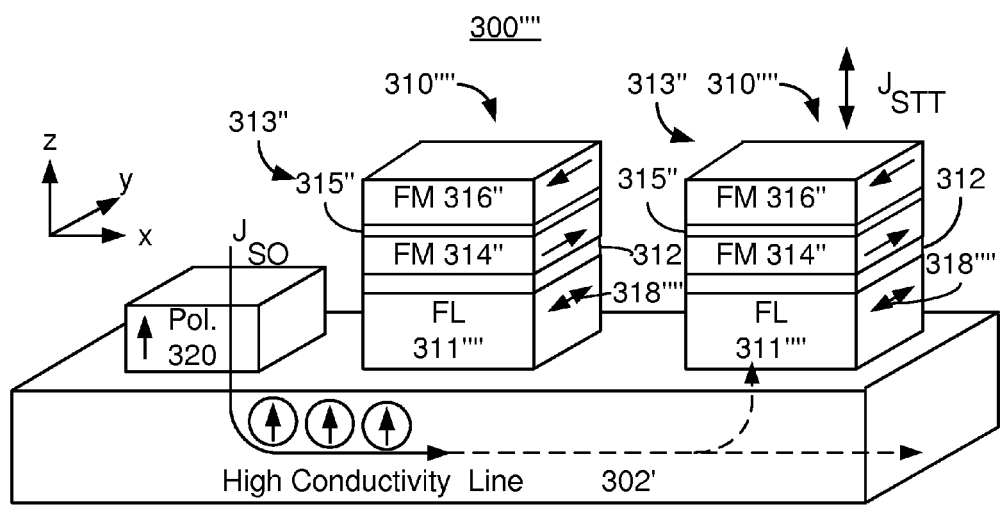
FIG. 18 depicts another exemplary embodiment of a portion of a magnetic memory including a magnetic junction having a free layer with a nonzero initial spin transfer torque at low temperature.

FIG. 18 depicts another exemplary embodiment of a magnetic memory 300'''' having a free layer with a nonzero initial spin transfer torque at low temperature. For clarity, FIG. 18 is not to scale. The magnetic memory 300'''' is analogous to the magnetic memory 300, 300', 300" and/or 300'''. The magnetic memory 300'''' is, however, most analogous to the memory 300". Consequently, similar components have corresponding labels. The magnetic memory 300'''' thus includes magnetic junction 310'''', and line 302' and polarizer 320 that are analogous to the magnetic junction 310/310'/310"/310''', the line 302/302' and the polarizer 320, respectively. The magnetic junction 310'''' may be used for the magnetic junction 130 depicted in FIG. 2. The magnetic junction 310'''' may be used in connection with a quantum processor 110 and may reside in and operate at the low temperature(s) of the low temperature environment 102. Further, the magnetic junction 310'''' is switchable between stable magnetic states. The magnetic junction 310'''' is also configured such that the free layer has a nonzero initial writing spin transfer torque in the absence of thermal fluctuations. In some embodiments, the magnetic junction 310'''' is also configured such that the shift field is substantially balanced at the free layer.

The magnetic memory 300'''' operates in an analogous manner to the magnetic memory 300'/300"/300'''. The free layer 311'''' is analogous to the free layers 311, 311', 311" and 311''' and has a magnetic moment 318'''' that is in-plane. For the stable states of the free layer 311'''', the magnetic moment lies along the easy axis 318'''' of the free layer 311''''. Because it is desired to have a high magnetoresistance, the free layer 311'''' may include Heusler alloy(s) and/or half metals. Further, the reference layer 313'''' is a SAF including ferromagnetic layer 314" and 316". Because the reference layer 313'''' is a SAF, the shift field due to the reference layer 313'''' may still be substantially balanced at the free layer 311''''. The magnetic anisotropy of the free layer 311'''' may thus be relatively low. As a result, the write current may be reduced. Note, however, that the magnetic junction may still have a shape anisotropy and/or sufficient other magnetic anisotropy to establish stable states of the free layer 311''''.

As discussed above with respect to the memories 300', 300" and 300''', the free layer 311'''' may be switched using a combination of spin torque due to the current corresponding to $J_{SO}$ and a spin transfer due to the current corresponding to the current density $J_{STT}$. Further, the current corresponding to $J_{SO}$ may be driven through the magnetic junction 310'''' or may bypass the magnetic junction 310''''. For reasons analogous to those discussed above for the memories 300', 300" and 300''', the magnetic memory 300'''' is also configured such that the free layer 311'''' has a nonzero initial spin transfer torque even in the absence of thermal fluctuations (i.e. at temperature(s) of the low temperature environment 102).

In addition, as can be seen in FIG. 18, the line 302' has a spin diffusion length that is sufficiently high that the polarizer 320 may be located further from the magnetic junction 310"" being programmed. Thus, a single polarizer 320 may serve multiple magnetic junctions 310"". However, only magnetic junctions 310"" that are selected, for example by having the current corresponding to $J_{STT}$ driven through them, are written.

The magnetic memory 300"" may have benefits analogous to those described above for the magnetic memories 300, 300', 300" and/or 300'". In particular, the magnetic memory 300'" may allow rapid storage of data magnetically at the low temperature environment with a read signal in a desired range and the benefits of the quantum computing device 100 to be achieved. Thus, the magnetic memory 300""/120 may be appropriate for use in the quantum computing device 100.

The magnetic junctions 300, 300', 300", 300'" and 300"" are depicted in the context of particular directions of magnetic moments. However, other directions are possible. For example, the SO line 302 is shown as having its polarization in-plane. However, in other embodiments, the SO line 302 may be polarized perpendicular-to-plane. Similarly, the free layers 311, 311', 311", 311'" and 311"" are shown as having stable magnetic states in-plane. In other embodiments, the free layers 311, 311', 311", 311'" and/or 311"" may have their easy axes perpendicular-to-plane or may be hybrid layers analogous to the free layers 269 and/or 269'. In such embodiments, the reference layer 313, 313', 313" and/or 313'" may also be polarized perpendicular to plane. In addition, in the magnetic memories 300, 300" and 300"", the reference layer 313, 313" and 313"" are shown as having their magnetic moment oriented parallel to the easy axis of the free layer 310, 310" and 310"", respectively, while the SO line 302 and polarizers 320 are polarized perpendicular to the free layer easy axis. In other embodiments, the orientations of the reference layers and SO line/polarizer may be switched. Thus, the reference layer 313, 313" and 313"" may have their magnetic moment oriented perpendicular to the easy axis of the free layer 310, 310" and 310"", respectively, while the SO line 302 and polarizers 320 are polarized parallel to the free layer easy axis. In such embodiments the reference layer magnetic moment provides the initial tilt away from the stagnation point and the SO pulse completes the switching. In even other embodiments, other configurations are possible. For example, the easy axes of all the free layers, reference layers and SO line polarization might be parallel to each other, in-plane, and/or perpendicular-to-plane. In such embodiments, the torques from the SO line 302 and the reference layer 313 are complimentary to each other for switching the cell. The switching current may thus be reduced. Such an embodiment may be particularly useful for a hybrid free layer.

Figure 19:
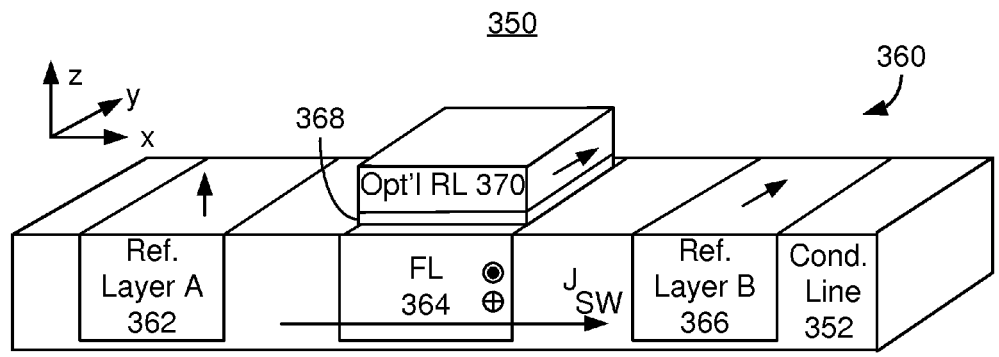
FIG. 19 depicts another exemplary embodiment of a portion of a magnetic memory including a magnetic junction having a free layer with a nonzero initial spin transfer torque at low temperature.

FIG. 19 depicts another exemplary embodiment of a portion of a magnetic memory 350 having a free layer with a nonzero initial spin transfer torque at low temperature. For clarity, FIG. 19 is not to scale. The magnetic memory 350 includes magnetic junction 360, which may be used for the magnetic junction 130 depicted in FIG. 2. Thus, the magnetic junction 360 is for use in a storage cell 124/124' of a quantum computing device magnetic memory 120. The magnetic memory 350 may be used in connection with a quantum processor 110 and may reside in and operate at the low temperature(s) of the low temperature environment 102.

Further, the magnetic junction 360 is switchable between stable magnetic states. The magnetic junction 360 is also configured such that the free layer has a nonzero initial spin transfer torque in the absence of thermal fluctuations. In other words, the magnetic junction 360 has a nonzero initial spin transfer torque for write operations at operating temperatures of the low temperature environment 102. In some embodiments, the magnetic junction is also configured such that the shift field is substantially balanced at the free layer.

The magnetic junction 360 includes a free layer 364 and reference layers 362 and 366 that are embedded in conductive line 352. Also shown are optional nonmagnetic spacer layer 368 and optional reference layer 370. In some embodiments, the optional nonmagnetic spacer layer 368 and optional reference layer 370 are used for reading the magnetic junction 360. Alternatively, the magnetoresistance due to differences in the alignment of the magnetic moments of the free layer 364 and the reference layer 366 may be used to read the magnetic junction 360. The nonmagnetic spacer layer 368 that may be a metal or an insulating barrier layer. Optional pinning layers (not shown) may be used for one or more of the reference layers 362, 366 and 370. The material(s) used for the free layer 364 and reference layers 362, 366 and 370 may be analogous to those described above. Although the free layer 364 and reference layers 362 and 366 are shown as occupying only a portion of the conductive line 352, in some embodiments, the layers 362, 364 and 366 occupy most or all of the line in order to reduce or eliminate current shunting from the magnetic layers.

The magnetic moment of the free layer 364 is in-plane. The magnetic anisotropy of the free layer 364 may thus be relatively low. As a result, the write current may be reduced. Note, however, that the magnetic junction may still have a shape anisotropy and/or sufficient other magnetic anisotropy to establish stable states of the free layer 364. For example, the cross section of the magnetic junction 310 in the x-y plane may be an ellipse having a long axis parallel to the y-axis, a stadium shape (rectangular with rounded corners), a rectangle, an ellipsoid, a hemi-sphere, or analogous shape.

The free layer is switched using a spin polarized current driven through the line 352. The current may be polarized by the reference layers 362 and 366. As a result, the magnetic junction 360 is configured such that the free layer 364 has a nonzero initial spin transfer torque even in the absence of thermal fluctuations (i.e. at temperature(s) of the low temperature environment 102). To program the magnetic junction 360, a write current may be driven through the line 352 in plane as shown. The magnetic moment of the reference layer 362 is perpendicular to the easy axis of the free layer 364. The current $J_{SW}$ through the line 352 may be spin polarized by the magnetic moment of the reference layer 362 to be at least partially polarized perpendicular to the free layer easy axis (perpendicular to the y-direction in FIG. 19). This polarized spin current exerts a torque that rapidly deflects the magnetic moment of the free layer 364 even in the absence of thermal fluctuations. Thus, the free layer 364 magnetic moment is deflected from the stagnation point even in the absence of thermal fluctuations. The current may also be polarized by the magnetic moment of the reference layer 366. Such a spin polarized current may complete switching of the free layer because this current is spin polarized in the direction of the easy axis (in the +y direction or the −y direction). Thus, the free layer 364 may be switched using a spin polarized current driven through the line 352 such that the free layer 364 has a nonzero initial spin transfer torque even in the absence of thermal fluctuations (i.e. at temperature(s) of the low temperature environment 102).

Use of the magnetic memory 350 in the quantum computing device magnetic memory 120 allows the storage of data magnetically at the low temperature environment and the benefits of the quantum computing device 100 to be achieved. For example, a higher giant magnetoresistance for the magnetic junction 360 due in part to the material(s) used in the free layer, may facilitate reading of the magnetic memory 120. A lower resistance in the low temperature environment 102, for example due to metallic nonmagnetic spacer layer 368, also facilitate reading and writing of the magnetic junction 360. A lower magnetic anisotropy for moment in-plane the free layer 364 allow for a lower write current to be used in programming the magnetic junction 360 and thus the memory 350/120. Further, a the magnetic junction 360 has a nonzero initial spin transfer torque for the free layer 364 in the absence of thermal fluctuations due to the spin polarized current from the line 352. This allows the magnetic junction 360 to be rapidly programmed at the operating temperature(s) of the magnetic memory 120. Thus, the magnetic memory 350/120 may be appropriate for use in the quantum computing device 100.

Figure 20:
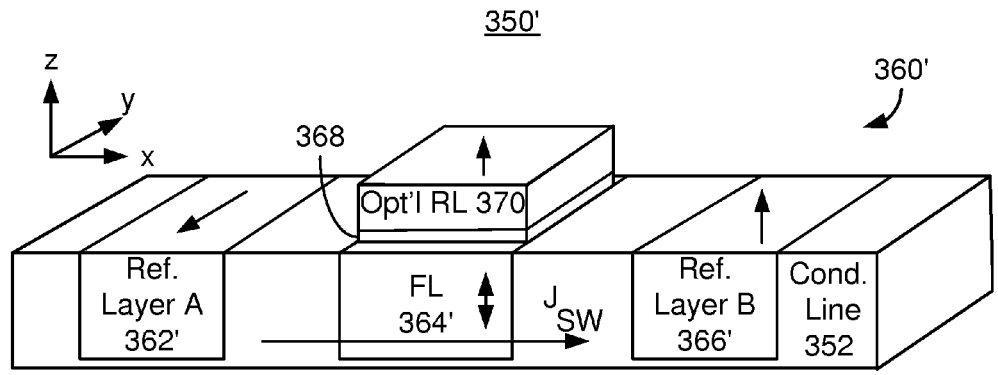
FIG. 20 depicts another exemplary embodiment of a portion of a magnetic memory including a magnetic junction having a free layer with a nonzero initial spin transfer torque at low temperature.

FIG. 20 depicts another exemplary embodiment of a magnetic memory 350' having a free layer with a nonzero initial spin transfer torque at low temperature. For clarity, FIG. 20 is not to scale. The magnetic memory 350' is analogous to the magnetic memory 350. Consequently, similar components have corresponding labels. The magnetic memory 350' thus includes a conductive line 352 and magnetic junction 360' having reference layers 362' and 366', free layer 366', optional spacer layer 368 and optional reference layer 370 that are analogous to the line 352 and the magnetic junction 360 having reference layer 362 and 366, free layer 364, optional spacer layer 368 and optional reference layer 370, respectively. The magnetic junction 360' may be used for the magnetic junction 130 depicted in FIG. 2. Thus, the magnetic junction 360' is for use in a storage cell 124/124' of a quantum computing device magnetic memory 120. The magnetic junction 360' may be used in connection with a quantum processor 110 and may reside in and operate at the low temperature(s) of the low temperature environment 102. Further, the magnetic junction 360' is switchable between stable magnetic states. The magnetic junction 360' is also configured such that the free layer has a nonzero initial writing spin transfer torque in the absence of thermal fluctuations. In some embodiments, the magnetic junction 360' is also configured such that the shift field is substantially balanced at the free layer 364' and/or the free layer 364' has a low magnetic anisotropy.

As can be seen in FIG. 20, the free layer 364' has an easy axis that is perpendicular-to-plane (along the z-axis). The magnetic moment of the reference layer 362' is still perpendicular to the free layer easy axis and may be used to polarize the write current to deflect the free layer magnetic moment from the stable state. The reference layer 366' has its magnetic moment along the free layer easy axis and is thus perpendicular-to-plane. The magnetic junction 360' functions in an analogous manner to the magnetic junction 360. Thus, the magnetic junction 360' and the magnetic memory 350' may be suitable for use in a quantum computing device.

Figure 21:
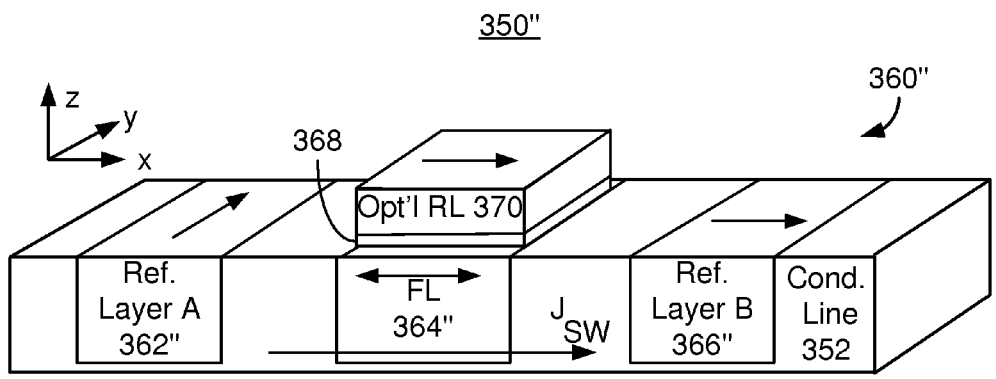
FIG. 21 depicts another exemplary embodiment of a portion of a magnetic memory including a magnetic junction having a free layer with a nonzero initial spin transfer torque at low temperature.

FIG. 21 depicts another exemplary embodiment of a magnetic memory 350" having a free layer with a nonzero initial spin transfer torque at low temperature. For clarity, FIG. 21 is not to scale. The magnetic memory 350" is analogous to the magnetic memory 350/350'. Consequently, similar components have corresponding labels. The magnetic memory 350" thus includes a conductive line 352 and magnetic junction 360" having reference layers 362" and 366", free layer 366", optional spacer layer 368 and optional reference layer 370 that are analogous to the line 352 and the magnetic junction 360/360' having reference layer 362/362' and 366/366', free layer 364/364', optional spacer layer 368 and optional reference layer 370, respectively. The magnetic junction 360" may be used for the magnetic junction 130 depicted in FIG. 2. Thus, the magnetic junction 360" is for use in a storage cell 124/124' of a quantum computing device magnetic memory 120. The magnetic junction 360" may be used in connection with a quantum processor 110 and may reside in and operate at the low temperature(s) of the low temperature environment 102. Further, the magnetic junction 360" is switchable between stable magnetic states. The magnetic junction 360" is also configured such that the free layer has a nonzero initial writing spin transfer torque in the absence of thermal fluctuations. In some embodiments, the magnetic junction 360" is also configured such that the shift field is substantially balanced at the free layer 364" and/or the free layer 364" has a low magnetic anisotropy.

As can be seen in FIG. 21, the free layer 364" has an easy axis that is in-plane. Thus, the free layer 364" is more analogous to the free layer 364. However, the direction of the free layer easy axis happens to be along the x-axis in the embodiment shown. The magnetic moment of the reference layer 362" is still perpendicular to the free layer easy axis and may be used to polarize the write current to deflect the free layer magnetic moment from the stable state. However, the reference layer 362" magnetic moment is in plane in the embodiment shown. The reference layer 366" has its magnetic moment along the free layer easy axis and is thus in-plane. The magnetic junction 360" functions in an analogous manner to the magnetic junction 360/360'. Thus, the magnetic junction 360" and the magnetic memory 350" may be suitable for use in a quantum computing device. Note that although specific direction of the magnetic moments of the layers 362, 362', 362", 364, 364', 364", 366, 366' and 366" are shown with respect to the x, y and z axes, the relative moments of the layers 362 364 and 366; 362', 364' and 366'; and 362", 364" and 366" are of more importance in the operation of the magnetic memories 350, 350' and 350". In addition, it is noted that magnetic moments of the layers within magnetic junctions 360, 360' and 360" are depicted as completed aligned or completed orthogonal. However, in some embodiments, only components of the magnetic moments may be aligned and/or orthogonal. In addition, in some embodiments, the free layers 364, 364' and 364" may include hybrid free layers such as the free layers 269, 269', and/or 269". In the magnetic junction 360, 360' and/or 360", the hybrid free layer may also include two components which are at the same level in the z-direction (both components located at the same elevation in the stack, but not at the same XY coordinates). The hard and soft components of the free layer may also have different locations. For example, in some embodiments, the hard and soft components may form a "core-shell" particle, with a hard core and soft shell. Similarly, the magnetic junctions 360 may be analogous to the junctions 250 and 250'.

Figure 22:
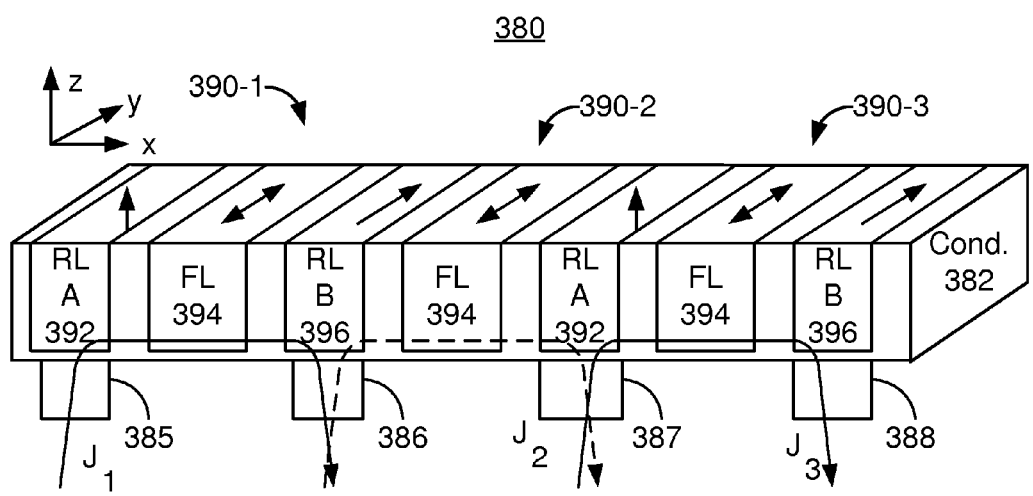
FIG. 22 depicts another exemplary embodiment of a portion of a magnetic memory including a magnetic junction having a free layer with a nonzero initial spin transfer torque at low temperature.

FIG. 22 depicts another exemplary embodiment of a portion of a magnetic memory 380 having a free layer with a nonzero initial spin transfer torque at low temperature. For clarity, FIG. 22 is not to scale. The magnetic memory 380 is analogous to the memory 350, but includes multiple magnetic junctions. The magnetic memory 380 includes conductive line 382 and magnetic junctions 390-1, 390-2 and 390-3 that are analogous to the conductive line 352 and magnetic junction 360. The magnetic junction 390-1, 390-2 and 390-3 may be used for the magnetic junction 130 depicted in FIG. 2. Thus, the magnetic junctions 390-1, 390-2 and 390-3 are for use in a storage cell 124/124' of a quantum computing device magnetic memory 120. The magnetic memory 380 may be used in connection with a quantum processor 110 and may reside in and operate at the low temperature(s) of the low temperature environment 102. Further, the magnetic junctions 390-1, 390-2 and 390-3 are switchable between stable magnetic states. The magnetic junctions 390-1, 390-2 and 390-3 are also configured such that the free layer has a nonzero initial spin transfer torque in the absence of thermal fluctuations. In other words, the magnetic junctions 390-1, 390-2 and 390-3 have a nonzero initial spin transfer torque for write operations at operating temperatures of the low temperature environment 102. In some embodiments, the magnetic junction is also configured such that the shift field is substantially balanced at the free layer. Although being shown as analogous to the magnetic junction 360, the magnetic junctions 390-1, 390-2 and 390-3 may be analogous to the magnetic junctions 360' and/or 360''. In addition, for clarity, any optional nonmagnetic spacer layer(s) and reference layer(s), such as the layers 368 and 370, are not shown.

The magnetic junctions 390-1, 390-2 and 390-3 share reference layers. Each of the magnetic junctions 390-1, 390-2 and 390-3 thus includes reference layers 392 and 396 as well as free layer 394. The reference layer 396 is shared between magnetic junctions 390-1 and 390-2. Similarly, the reference layer 392 is shared between magnetic junctions 390-2 and 390-3. Also shown are selection devices 385, 386, 387 and 388. The selection devices 385, 386, 387 and 388 may, for example, be transistors. The transistors 385 and 386 are used to control a write current driven through the magnetic junction 390-1. The transistors 386 and 387 are used to control a write current driven through the magnetic junction 390-2. The transistors 387 and 388 are used to control a write current driven through the magnetic junction 390-3.

The magnetic memory 380 operates in an analogous manner to the magnetic memory 350, 350' and/or 350''. Use of the magnetic memory 380 in the quantum computing device magnetic memory 120 allows the storage of data magnetically at the low temperature environment and the benefits of the quantum computing device 100 to be achieved. Thus, the magnetic memory 380 may be appropriate for use in the quantum computing device 100.

Figure 23:
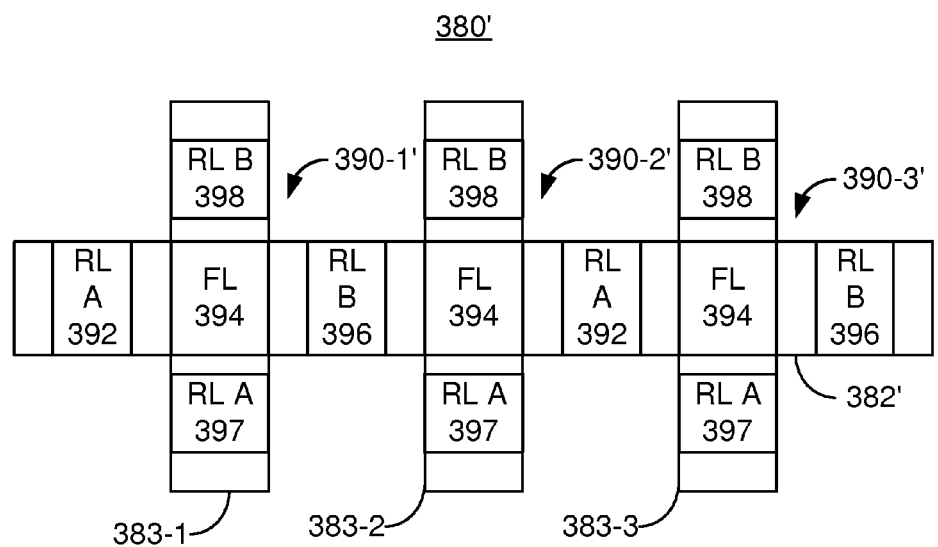
FIG. 23 depicts another exemplary embodiment of a portion of a magnetic memory including a magnetic junction having a free layer with a nonzero initial spin transfer torque at low temperature.

FIG. 23 depicts another exemplary embodiment of a magnetic memory 380' having a free layer with a nonzero initial spin transfer torque at low temperature. For clarity, FIG. 23 is not to scale. The magnetic memory 380' is analogous to the magnetic memory 380. Consequently, similar components have corresponding labels. The magnetic memory 380' thus includes a conductive line 382' and magnetic junctions 390-1', 390-2' and 390-3' that are analogous to the conductive line 382 and magnetic junctions 390-1, 390-2 and 390-3, respectively. In addition, each magnetic junction 390-1', 390-2' and 390-3' includes two additional reference layers 397 and 398. Reference layers 397 are analogous to reference layers 392, which have their magnetic moments oriented perpendicular to the free layer easy axis. Reference layers 398 are analogous to reference layers 396, which have their moments oriented along the free layer easy axis. As discussed above with respect to the magnetic junctions 360, 360', and 360'', the free layers may have another structure analogous to the that in the magnetic junction 250, 250', 265, 265', and/or 265''.

Although the magnetic memory 380' functions in an analogous manner to the magnetic memories 350, 350', 350'' and/or 380, the magnetic memory 380' may be programmed by multiple write currents. For example, the magnetic junction 390-1' may be programmed by write currents driven through 382' and 383-1. The magnetic junction 390-2' may be programmed by write currents driven through 382' and 383-2. The magnetic junction 390-3' may be programmed by write currents driven through 382' and 383-3.

The magnetic memory 380' operates in an analogous manner to the magnetic memory 380, 350, 350' and/or 350''. Use of the magnetic memory 380' in the quantum computing device magnetic memory 120 allows the storage of data magnetically at the low temperature environment and the benefits of the quantum computing device 100 to be achieved. Thus, the magnetic memory 380' may be appropriate for use in the quantum computing device 100.

Figure 24:
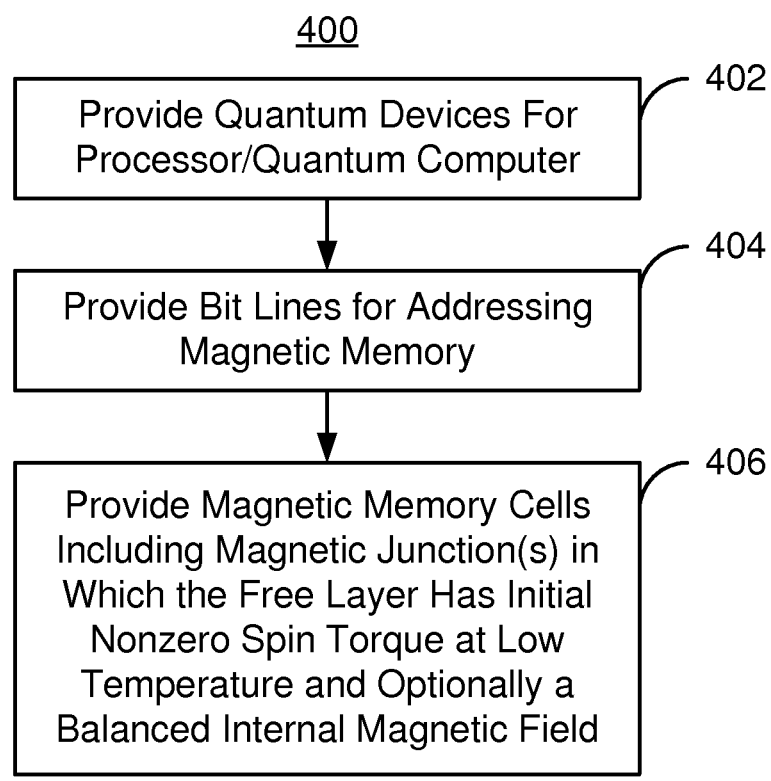
FIG. 24 depicts an exemplary embodiment of a method for fabricating a quantum computing device magnetic memory.

FIG. 24 depicts an exemplary embodiment of a method 400 for fabricating a quantum computing device magnetic memory. For simplicity, some steps may be omitted, combined, and/or interleaved. The method 400 is described in the context of the quantum computing device magnetic memory 120, magnetic storage cell 124/124' and magnetic junction 130. However, the method 800 may be used to provide other magnetic memories including but not limited to the magnetic memories 280, 280', 280'', 300, 300', 300'', 300''', 300'''', 350, 350', 350'', 380 and/or 380' and the magnetic junctions 200, 200', 200'', 250, 250', 265, 265', 265'', 290, 290', 290'', 310, 310', 310'', 310''', 310'''', 360, 360', 360'', 390-1, 390-2, 390-3, 390-1', 390'2' and/or 390-3'.

The quantum device(s) 112 and the quantum processor 110 are provided, via step 402. The bit lines 122 are provided for the magnetic storage cells 124/124', via step 404.

The magnetic storage cells 124/124' are provided, via step 406. Step 406 includes providing the magnetic junction(s) 130 for each of the storage cells 124/124'. The magnetic junction(s) provided in step 406 are configured to allow the free layer 134 to be switched between stable magnetic states and such that the free layer 134 has a nonzero initial writing spin torque in an absence of thermal fluctuations. In some embodiments, step 406 also include providing the pinned layer(s) 132 and, where present, 136 such that the shift field is substantially balanced at the free layer 134. Fabrication of the magnetic memory 120 may then be completed. Thus, using the method 400, the benefits of one or more of the magnetic memories 120, 280, 280', 280'', 300, 300', 300'', 300''', 300'''', 350, 350', 350'', 380 and/or 380' and the magnetic junctions 130, 200, 200', 200'', 250, 250', 265, 265', 265'', 290, 290', 290'', 310, 310', 310'', 310''', 310'''', 360, 360', 360'', 390-1, 390-2, 390-3, 390-1', 390'2' and/or 390-3' may be achieved.

Thus, the magnetic memories 120, 280, 280', 280'', 300, 300', 300'', 300''', 300'''', 350, 350', 350'', 380 and/or 380'' and the magnetic junctions 130, 200, 200', 200'', 250, 250', 265, 265', 265'', 290, 290', 290'', 310, 310', 310'', 310''', 310'''', 360, 360', 360'', 390-1, 390-2, 390-3, 390-1', 390'2' and/or 390-3' may be formed. Consequently, the benefits of the quantum computing device 100 may be achieved.

A method and system for providing a magnetic memory suitable for use in a quantum computing device has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A quantum computing device magnetic memory coupled with a quantum processor including at least one quantum device corresponding to at least one qubit, the quantum computing device magnetic memory comprising:
a plurality of magnetic storage cells coupled with the at least one quantum device, each of the plurality of magnetic storage cells including at least one magnetic junction, the at least one magnetic junction including a reference layer, a nonmagnetic spacer layer, and a free layer, the nonmagnetic spacer layer residing between the reference layer and the free layer, the at least one magnetic junction being configured to allow the free layer to be switched between a plurality of stable magnetic states and wherein the at least one magnetic junction is configured such that the free layer has a nonzero initial writing spin transfer torque in an absence of thermal fluctuations; and
a plurality of bit lines coupled to the plurality of magnetic storage cells.

2. The quantum computing device magnetic memory of claim 1 wherein each of the at least one magnetic junction is configured such that a shift magnetic field is substantially balanced at the free layer.

3. The quantum computing device magnetic memory of claim 2 wherein the free layer is switched using a magnetic field applied at a nonzero angle from the free layer easy axis and wherein the plurality of bit lines include a plurality of spin orbit coupling (SO) active lines and wherein the quantum computing device magnetic memory further includes:
a plurality of word lines coupled with the plurality of magnetic storage cells and oriented substantially perpendicular to the plurality of bit lines.

4. The quantum computing device magnetic memory of claim 2 wherein the free layer is configured to have a voltage controlled anisotropy that destabilizes a current stable magnetic state of the plurality of stable magnetic states and wherein the quantum computing device magnetic memory further includes:
a plurality of word lines coupled with the plurality of magnetic storage cells and oriented substantially perpendicular to the plurality of bit lines, the plurality of word lines including at least one polarizing element to provide a spin polarized current through the word line, the spin polarized current providing a spin current capable of switching only the free layer of the at least one magnetic junction in the at least one selected magnetic storage cell, the polarizing element being separate from the at least one magnetic junction; and
wherein each of the plurality of bit lines includes the reference layer for each of the at least one magnetic junction, the reference layer being an extended reference layer, the nonmagnetic spacer layer being an insulating barrier layer such that a voltage may be developed across the insulating barrier layer to provide the voltage that selects at least one selected magnetic storage cell of the plurality of magnetic storage cells using the voltage controlled anisotropy without the electric current passing through the free layer.

5. The quantum computing device magnetic memory of claim 2 wherein the at least one magnetic junction is selected based upon a cross point architecture such that a bit line of the plurality of bit lines and an additional line substantially perpendicular to the bit line are enabled, the quantum computing device magnetic memory further including:
a plurality of word lines coupled with the plurality of magnetic storage cells, including the additional line and oriented substantially perpendicular to the plurality of bit lines, each of the plurality of word lines including at least one of a polarizing element to provide a spin polarized current through the word line and at least one spin-orbit interaction (SO) active material;
wherein each of the plurality of bit lines includes at least one of at least one additional SO material and at least one additional polarizing element to provide a spin polarized current through the bit line, the spin polarized current providing a spin current capable of switching only the free layer of the at least one magnetic junction in at least one selected magnetic storage cell;
wherein each of the at least one magnetic junction includes an insulating barrier layer; and
wherein the free layer includes a first ferromagnetic layer and a second ferromagnetic layer, the nonmagnetic spacer layer being between the reference layer and the first ferromagnetic layer, the insulating barrier layer being between the second free layer and the reference layer.

6. The quantum computing device magnetic memory of claim 2 wherein the free layer is switched using a spin-orbit interaction (SO) current and wherein at least one of the plurality of bit lines includes at least one SO active layer adjacent to the magnetic junction and the magnetic memory includes a plurality of polarizers adjacent to the plurality of bit lines, the plurality of polarizers for providing a spin polarized current polarized in a direction substantially perpendicular to the free layer easy axis.

7. The quantum computing device magnetic memory of claim 6 wherein the spin polarized current passes through the free layer.

8. The quantum computing device magnetic memory of claim 6 wherein the free layer easy axis is in-plane.

9. The quantum computing device magnetic memory of claim 6 wherein at least one unselected magnetic storage cell of the plurality of magnetic storage cells resides along the bit line between a closest polarizer of the plurality of polarizers and a selected memory cell of the plurality of magnetic storage cells.

10. A quantum computing device magnetic memory coupled with a quantum processor including at least one quantum device corresponding to at least one qubit, the quantum computing device magnetic memory comprising:
a plurality of magnetic storage cells coupled with the at least one quantum device, each of the plurality of magnetic storage cells including at least one magnetic junction, the at least one magnetic junction including a reference layer, a nonmagnetic spacer layer, and a free layer, the nonmagnetic spacer layer residing between the reference layer and the free layer, the at least one magnetic junction being configured to allow the free layer to be switched between a plurality of stable magnetic states and wherein the at least one magnetic junction is configured such that the free layer has a nonzero initial writing spin transfer torque in an absence of thermal fluctuations; and
a plurality of bit lines coupled to the plurality of magnetic storage cells;
wherein the at least one magnetic junction is configured such that a zero initial spin transfer torque corresponds to a free layer stagnation point and a direction along a free layer easy axis;

wherein the at least one magnetic junction includes at least one of an extended orthogonal spin transfer junction, a spatially varying magnetization reference layer (SVMRL) dual magnetic junction, and a hybrid free layer magnetic junction;

wherein the extended orthogonal spin transfer junction includes the reference layer that is a synthetic antiferromagnetic reference layer, the free layer, the nonmagnetic spacer layer, an additional nonmagnetic spacer layer and an additional reference layer, the additional nonmagnetic spacer layer being between the free layer and the additional reference layer, the additional reference layer being an extended reference layer, the synthetic antiferromagnetic reference layer having synthetic reference layer magnetic moments, the extended reference layer having an extended reference layer magnetic moment and extending further than the free layer in a direction parallel to the free layer easy axis, the synthetic reference layer magnetic moments being substantially along the easy axis if the extended reference layer magnetic moment is substantially perpendicular to the free layer easy axis, the extended reference layer magnetic moment being substantially along the free layer easy axis if the synthetic reference layer magnetic moments are substantially perpendicular to the free layer easy axis;

wherein the SVMRL dual magnetic junction includes the reference layer, the nonmagnetic spacer layer, the free layer having the free layer easy axis, the additional nonmagnetic spacer layer and the additional reference layer, the SVMRL dual magnetic junction being configured such that the reference layer and the additional reference layer each has a spatially varying magnetic moment such that a central portion is substantially parallel to the free layer easy axis and an edge portion is substantially perpendicular to the free layer easy axis;

wherein the hybrid free layer includes the reference layer, the nonmagnetic spacer layer and the free layer, the free layer being a hybrid free layer such that the free layer easy axis is substantially perpendicular to plane, the reference layer is an extended perpendicular to plane reference layer having a magnetic moment substantially parallel to the free layer easy axis and extending further than the free layer in a direction perpendicular to the free layer easy axis and each of the plurality of stable magnetic states is such that a free layer magnetic moment is at a nonzero angle around the free layer easy axis.

11. The quantum computing device magnetic memory of claim 10 wherein if the at least one magnetic junction includes the extended orthogonal spin transfer junction, then the extended orthogonal spin transfer junction includes a half metallic insertion layer between the extended reference layer and the additional nonmagnetic spacer layer.

12. The quantum computing device magnetic memory of claim 10 wherein if the at least one magnetic junction includes the hybrid free layer magnetic junction then the hybrid free layer includes at least one of an easy-cone anisotropy layer and a plurality of ferromagnetic layers interleaved with at least one nonmagnetic spacer layer, the plurality of ferromagnetic layers being exchanged coupled, a first ferromagnetic layer of the plurality of ferromagnetic layers having an in-plane magnetic moment, a second ferromagnetic layer of the plurality of ferromagnetic layers having a perpendicular to plane magnetic moment.

13. A quantum computing device comprising:
a quantum processor including at least one quantum device corresponding to at least one qubit;
a plurality of magnetic storage cells coupled with the quantum processor, each of the plurality of magnetic storage cells including at least one magnetic junction, the at least one magnetic junction including a reference layer, a nonmagnetic spacer layer, and a free layer, the nonmagnetic spacer layer residing between the reference layer and the free layer, the at least one magnetic junction being configured to allow the free layer to be switched between a plurality of stable magnetic states and wherein the at least one magnetic junction is configured such that the free layer has a nonzero initial writing spin transfer torque in an absence of thermal fluctuations; and
a plurality of bit lines coupled to the plurality of magnetic storage cells.

14. The quantum computing device of claim 13 wherein the free layer is configured to have a voltage controlled anisotropy that destabilizes a current stable magnetic state of the plurality of stable magnetic states and wherein the quantum computing device magnetic memory further includes:
a plurality of word lines coupled with the plurality of magnetic storage cells and oriented substantially perpendicular to the plurality of bit lines, the plurality of word lines including at least one polarizing element separate from the at least one magnetic junction to provide a spin polarized current through the word line, the spin polarized current providing a spin current capable of switching only the free layer of the at least one magnetic junction in the at least one selected magnetic storage cell; and
wherein each of the plurality of bit lines includes the reference layer for each of the at least one magnetic junction, the reference layer being an extended reference layer, the nonmagnetic spacer layer being an insulating barrier layer such that a voltage may be developed across the insulating barrier layer to provide the voltage that selects at least one selected magnetic storage cell of the plurality of magnetic storage cells using the voltage controlled anisotropy without the electric current passing through the free layer.

15. The quantum computing device of claim 13 wherein the at least one magnetic junction is selected based upon a cross point architecture such that a bit line of the plurality of bit lines and an additional line substantially perpendicular to the bit line are enabled, the quantum computing device magnetic memory further including:
a plurality of word lines coupled with the plurality of magnetic storage cells, including the additional line and oriented substantially perpendicular to the plurality of bit lines, each of the plurality of word lines including at least one of a polarizing element to provide a spin polarized current through the word line and at least one spin-orbit coupling (SO) active material;
wherein each of the plurality of bit lines includes at least one of at least one additional SO active material and at least one additional polarizing element to provide a spin polarized current through the bit line, the spin polarized current providing a spin current capable of switching only the free layer of the at least one magnetic junction in at least one selected magnetic storage cell;
wherein each of the at least one magnetic junction includes an insulating barrier layer; and wherein the free layer includes a first ferromagnetic layer and a second ferromagnetic layer, the nonmagnetic spacer layer being between the reference layer and the first ferromagnetic layer, the insulating barrier layer being between the second free layer and the reference layer.

16. The quantum computing device of claim 13 wherein the free layer is switched using a spin orbit coupling (SO) current and wherein at least one of the plurality of bit lines includes at least one SO active layer adjacent to the free layer and the magnetic memory includes a plurality of polarizers adjacent to the plurality of bit lines, the plurality of polarizers for providing a spin polarized current in a direction substantially perpendicular to the free layer easy axis, the plurality of polarizers being separate from the at least one magnetic junction.

17. A quantum computing device comprising:
a quantum processor including at least one quantum device corresponding to at least one qubit;
a plurality of magnetic storage cells coupled with the quantum processor, each of the plurality of magnetic storage cells including at least one magnetic junction, the at least one magnetic junction including a reference layer, a nonmagnetic spacer layer, and a free layer, the nonmagnetic spacer layer residing between the reference layer and the free layer, the at least one magnetic junction being configured to allow the free layer to be switched between a plurality of stable magnetic states and wherein the at least one magnetic junction is configured such that the free layer has a nonzero initial writing spin transfer torque in an absence of thermal fluctuations; and
a plurality of bit lines coupled to the plurality of magnetic storage cells;
wherein the at least one magnetic junction is configured such that a zero initial spin transfer torque corresponds to a free layer stagnation point and a direction along a free layer easy axis;
wherein the at least one magnetic junction includes at least one of an extended orthogonal spin transfer junction, a spatially varying magnetization reference layer (SVMRL) dual magnetic junction, and a hybrid free layer magnetic junction;
wherein the extended orthogonal spin transfer junction includes the reference layer that is a synthetic antiferromagnetic reference layer, the free layer, the nonmagnetic spacer layer, an additional nonmagnetic spacer layer and an additional reference layer, the additional nonmagnetic spacer layer being between the free layer and the additional reference layer, the additional reference layer being an extended reference layer, the synthetic antiferromagnetic reference layer having synthetic reference layer magnetic moments, the extended reference layer having an extended reference layer magnetic moment and extending further than the free layer in a direction parallel to the free layer easy axis, the synthetic reference layer magnetic moments being substantially along the easy axis if the extended reference layer magnetic moment is substantially perpendicular to the free layer easy axis, the extended reference layer magnetic moment being substantially along the free layer easy axis if the synthetic reference layer magnetic moments are substantially perpendicular to the free layer easy axis;
wherein the SVMRL dual magnetic junction includes the reference layer, the nonmagnetic spacer layer, the free layer having the free layer easy axis, the additional nonmagnetic spacer layer and the additional reference layer, the SVMRL dual magnetic junction being configured such that the reference layer and the additional reference layer each has a spatially varying magnetic moment such that a central portion is substantially parallel to the free layer easy axis and an edge portion is substantially perpendicular to the free layer easy axis;
wherein the hybrid free layer includes the reference layer, the nonmagnetic spacer layer and the free layer, the free layer being a hybrid free layer such that the free layer easy axis is substantially perpendicular to plane, the reference layer is an extended perpendicular to plane reference layer having a magnetic moment substantially parallel to the free layer easy axis and extending further than the free layer in a direction perpendicular to the free layer easy axis, and each of the plurality of stable magnetic states is such that a free layer magnetic moment is at a nonzero angle around the free layer easy axis.

18. A method for fabricating a quantum computing device magnetic memory coupled with a quantum processor including at least one quantum device corresponding to at least one qubit, the method comprising:
providing a plurality of magnetic storage cells, each of the plurality of magnetic storage cells including at least one magnetic junction, the at least one magnetic junction including a reference layer, a nonmagnetic spacer layer, and a free layer, the nonmagnetic spacer layer residing between the reference layer and the free layer, the at least one magnetic junction being configured to allow the free layer to be switched between a plurality of stable magnetic states and wherein the at least one magnetic junction is configured such that the free layer has a nonzero initial writing spin transfer torque in an absence of thermal fluctuations; and
providing a plurality of bit lines coupled to the plurality of magnetic storage cells.

19. The method of claim 18 wherein each of the at least one magnetic junction is configured such that a shift magnetic field is substantially balanced at the free layer.

20. A method for fabricating a quantum computing device magnetic memory coupled with a quantum processor including at least one quantum device corresponding to at least one qubit, the method comprising:
providing a plurality of magnetic storage cells, each of the plurality of magnetic storage cells including at least one magnetic junction, the at least one magnetic junction including a reference layer, a nonmagnetic spacer layer, and a free layer, the nonmagnetic spacer layer residing between the reference layer and the free layer, the at least one magnetic junction being configured to allow the free layer to be switched between a plurality of stable magnetic states and wherein the at least one magnetic junction is configured such that the free layer has a nonzero initial writing spin transfer torque in an absence of thermal fluctuations; and
providing a plurality of bit lines coupled to the plurality of magnetic storage cells;
wherein the at least one magnetic junction is configured such that a zero initial spin transfer torque corresponds to a free layer stagnation point and a direction along a free layer easy axis;
wherein the at least one magnetic junction includes at least one of an extended orthogonal spin transfer junction, a spatially varying magnetization reference layer (SVMRL) dual magnetic junction, and a hybrid free layer magnetic junction;

wherein the extended orthogonal spin transfer junction includes the reference layer that is a synthetic antiferromagnetic reference layer, the free layer, the nonmagnetic spacer layer, an additional nonmagnetic spacer layer and an additional reference layer, the additional nonmagnetic spacer layer being between the free layer and the additional reference layer, the additional reference layer being an extended reference layer, the synthetic antiferromagnetic reference layer having synthetic reference layer magnetic moments, the extended reference layer having an extended reference layer magnetic moment and extending further than the free layer in a direction parallel to the free layer easy axis, the synthetic reference layer magnetic moments being substantially along the easy axis if the extended reference layer magnetic moment is substantially perpendicular to the free layer easy axis, the extended reference layer magnetic moment being substantially along the free layer easy axis if the synthetic reference layer magnetic moments are substantially perpendicular to the free layer easy axis;

wherein the SVMRL dual magnetic junction includes the reference layer, the nonmagnetic spacer layer, the free layer having the free layer easy axis, the additional nonmagnetic spacer layer and the additional reference layer, the SVMRL dual magnetic junction being configured such that the reference layer and the additional reference layer each has a spatially varying magnetic moment such that a central portion is substantially parallel to the free layer easy axis and an edge portion is substantially perpendicular to the free layer easy axis;

wherein the hybrid free layer includes the reference layer, the nonmagnetic spacer layer and the free layer, the free layer being a hybrid free layer such that the free layer easy axis is substantially perpendicular to plane, the reference layer is an extended perpendicular to plane reference layer having a magnetic moment substantially parallel to the free layer easy axis and extending further than the free layer in a direction perpendicular to the free layer easy axis and each of the plurality of stable magnetic states is such that a free layer magnetic moment is at a nonzero angle around the free layer easy axis.

* * * * *